US012805292B2

(12) United States Patent
Lee et al.

(10) Patent No.: US 12,805,292 B2
(45) Date of Patent: Nov. 17, 2026

(54) INTEGRATED CIRCUIT DEVICE WITH DUMMY CONTACT

(71) Applicant: SAMSUNG ELECTRONICS CO., LTD., Suwon-si (KR)

(72) Inventors: Jinwoo Lee, Suwon-si (KR); Yubo Qian, Suwon-si (KR); Hyunjae Kang, Suwon-si (KR); Gyeongseop Kim, Suwon-si (KR); Sutae Kim, Suwon-si (KR); Jaeyoung Park, Suwon-si (KR); Jeonwon Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 341 days.

(21) Appl. No.: 18/419,715

(22) Filed: Jan. 23, 2024

(65) Prior Publication Data

US 2024/0321726 A1 Sep. 26, 2024

(30) Foreign Application Priority Data

Mar. 24, 2023 (KR) ........................ 10-2023-0039294

(51) Int. Cl.

| | |
|---|---|
| ***H10W 20/42*** | (2026.01) |
| ***H10D 30/67*** | (2025.01) |
| ***H10D 64/23*** | (2025.01) |
| ***H10D 84/83*** | (2025.01) |
| ***H10W 20/41*** | (2026.01) |
| ***H10W 20/43*** | (2026.01) |

(52) U.S. Cl.

CPC ........ *H10W 20/42* (2026.01); *H10D 30/6735* (2025.01); *H10D 64/256* (2025.01);

(Continued)

(58) Field of Classification Search

CPC .... H10D 64/256; H10D 84/83; H10D 84/834; H10D 30/6735; H10D 64/254;

(Continued)

(56) References Cited

U.S. PATENT DOCUMENTS 8,766,322 B2 7/2014 Okamoto et al.
10,079,172 B2 9/2018 Oh et al.

(Continued)

FOREIGN PATENT DOCUMENTS

| | | | |
|---|---|---|---|
| DE | 10356097 A1 * | 6/2004 | .......... H10W 20/056 |
| JP | 2009-267094 A | 11/2009 | |

(Continued)

OTHER PUBLICATIONS

Office Action in Korean Appln. No. 10-2023-0039294, mailed on Aug. 5, 2026, 12 pages (with English translation).

*Primary Examiner* — Matthew E Warren
(74) *Attorney, Agent, or Firm* — Fish & Richardson P.C.

(57) ABSTRACT

An integrated circuit device includes a first conductive pattern disposed on a substrate, a second conductive pattern surrounding a portion of the first conductive pattern and covering a lower portion of a sidewall of the first conductive pattern, an upper insulation structure on the first conductive pattern and the second conductive pattern, and an upper conductive pattern penetrating through the upper insulation structure and extending in a vertical direction, wherein the upper conductive pattern includes a main plug portion overlapping the first conductive pattern and the second conductive pattern in the vertical direction, and a vertical extension extending from a portion of the main plug portion toward the substrate, covering an upper of the upper sidewall of the first conductive pattern, and overlapping the second conductive pattern in the vertical direction, and a dummy contact is formed on a single diffusion break region on the substrate.

9 Claims, 26 Drawing Sheets

(52) U.S. Cl.
CPC ........... *H10D 84/83* (2025.01); *H10D 84/834* (2025.01); *H10W 20/422* (2026.01); *H10W 20/425* (2026.01); *H10W 20/43* (2026.01); *H10W 20/438* (2026.01)

(58) Field of Classification Search
CPC ... H10W 20/40; H10W 20/42; H10W 20/422; H10W 20/425; H10W 20/43; H10W 20/438
See application file for complete search history.

(56) References Cited

U.S. PATENT DOCUMENTS

| | | | | |
|---|---|---|---|---|
| 11,257,769 | B2 | 2/2022 | Lu | |
| 2004/0104471 | A1 | 6/2004 | Gernhardt et al. | |
| 2011/0031536 | A1 * | 2/2011 | Okamoto | H10D 84/907 257/E27.108 |
| 2011/0221067 | A1 | 9/2011 | Ikegami et al. | |
| 2014/0252653 | A1 | 9/2014 | Okamoto et al. | |
| 2017/0069533 | A1 | 3/2017 | Kim et al. | |
| 2019/0115351 | A1 * | 4/2019 | Jeon | H10D 62/115 |
| 2020/0303501 | A1 | 9/2020 | Iwahori | |
| 2023/0231024 | A1 * | 7/2023 | Shin | H10D 30/6219 257/288 |
| 2024/0128319 | A1 * | 4/2024 | Kim | H10D 62/121 |

FOREIGN PATENT DOCUMENTS

| | | | |
|---|---|---|---|
| KR | 10-2021-0002347 | A | 1/2021 |
| KR | 10-2021-0121998 | A | 10/2021 |
| KR | 10-2023-0041108 | A | 3/2023 |

* cited by examiner

INTEGRATED CIRCUIT DEVICE WITH DUMMY CONTACT

CROSS-REFERENCE TO RELATED APPLICATIONS

This application is based on and claims priority under 35 U.S.C. § 119 to Korean Patent Application No. 10-2023-0039294, filed on Mar. 24, 2023, in the Korean Intellectual Property Office, the disclosure of which is incorporated by reference herein in its entirety.

BACKGROUND

1. Field

Embodiments relate to an integrated circuit device, and more particularly, to an integrated circuit device additionally including a dummy contact in an active region.

2. Description of the Related Art

Due to characteristics including miniaturization, multi-functionality, and/or low manufacturing cost, semiconductor devices are spotlighted as an important element in the electronics industry. Semiconductor devices may be classified into semiconductor memory devices that store logic data, semiconductor logic devices that operate and process logic data, and hybrid semiconductor devices including memory elements and logic elements.

As the electronics industry is highly developed, demands on the properties of semiconductor devices are gradually increasing. For example, demands for high reliability, high speed, and/or multi-functionality of semiconductor devices are gradually increasing. To satisfy such demanded properties, structures in semiconductor devices are becoming increasingly complex and highly integrated.

SUMMARY

According to an aspect of embodiments, there is provided an integrated circuit device including a first conductive pattern disposed on a substrate, a second conductive pattern surrounding a portion of the first conductive pattern and covering a lower portion of a sidewall of the first conductive pattern, an upper insulation structure on the first conductive pattern and the second conductive pattern, and an upper conductive pattern penetrating through the upper insulation structure and extending in a vertical direction, wherein the upper conductive pattern includes a main plug portion overlapping the first conductive pattern and the second conductive pattern in the vertical direction, and a vertical extension extending from a portion of the main plug portion toward the substrate, covering an upper of the upper sidewall of the first conductive pattern, and overlapping the second conductive pattern in the vertical direction, and a dummy contact is formed on a single diffusion break region on the substrate.

According to another aspect of embodiments, there is provided an integrated circuit device including a fin-type active region protruding on the substrate, a source/drain region disposed on the fin-type active region, a gate line extending over the fin-type active region in a direction crossing the fin-type active region, an insulation structure disposed on the source/drain region, a source/drain contact configured to penetrate through the insulation structure in a vertical direction and be connected to the source/drain region, an upper insulation structure disposed on each of the source/drain contact and the gate line, a first upper conductive pattern configured to penetrate through the upper insulation structure in the vertical direction and be connected to the source/drain contact, and a second upper conductive pattern configured to penetrate through the upper insulation structure in the vertical direction and be connected to the gate line, wherein at least one of the source/drain contact and the gate line includes a first conductive pattern and a second conductive pattern surrounding a portion of the first conductive pattern and covering a lower portion of a sidewall of the first conductive pattern, at least one of the first upper conductive pattern and the second upper conductive pattern includes a main plug portion overlapping the first conductive pattern and the second conductive pattern in the vertical direction, and a vertical extension extending from a portion of the main plug portion toward the substrate, covering an upper of the upper sidewall of the first conductive pattern, and overlapping the second conductive pattern in the vertical direction, and a portion of the source/drain region includes a dummy contact.

According to yet another aspect of embodiments, there is provided an integrated circuit device including a fin-type active region extending long in a first horizontal direction on a substrate, at least one nano-sheet disposed over the fin-type active region, a source/drain region facing the at least one nano-sheet in the first horizontal direction, a gate line extending long in a second horizontal direction crossing the first horizontal direction and surrounding the at least one nano-sheet on the fin-type active region, a source/drain contact configured to penetrate through an insulation structure in a vertical direction and be connected to the source/drain region, a via contact configured to penetrate through an upper insulation structure in the vertical direction and be connected to the source/drain contact, and a gate contact configured to penetrate through the upper insulation structure in the vertical direction and be connected to the gate line, wherein the source/drain contact includes a contact plug and a conductive barrier pattern surrounding a portion of the contact plug and covering a lower portion of a sidewall of the contact plug, the via contact includes a first main plug portion overlapping the contact plug and the conductive barrier pattern in the vertical direction and a first vertical extension extending from a portion of the first main plug toward the substrate, covering an upper portion of a sidewall of the contact plug, and overlapping the conductive barrier pattern in the vertical direction, and a dummy contact is formed on a portion of a single diffusion break region or a source/drain region.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
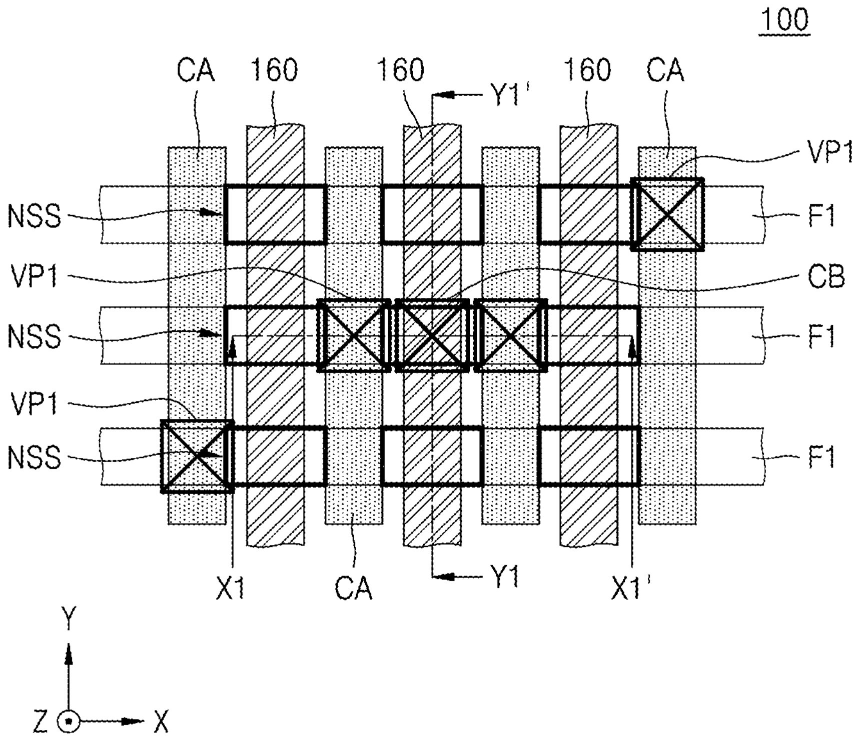
FIG. 1 is a plan layout diagram of an integrated circuit device according to embodiments.
Figure 2A:
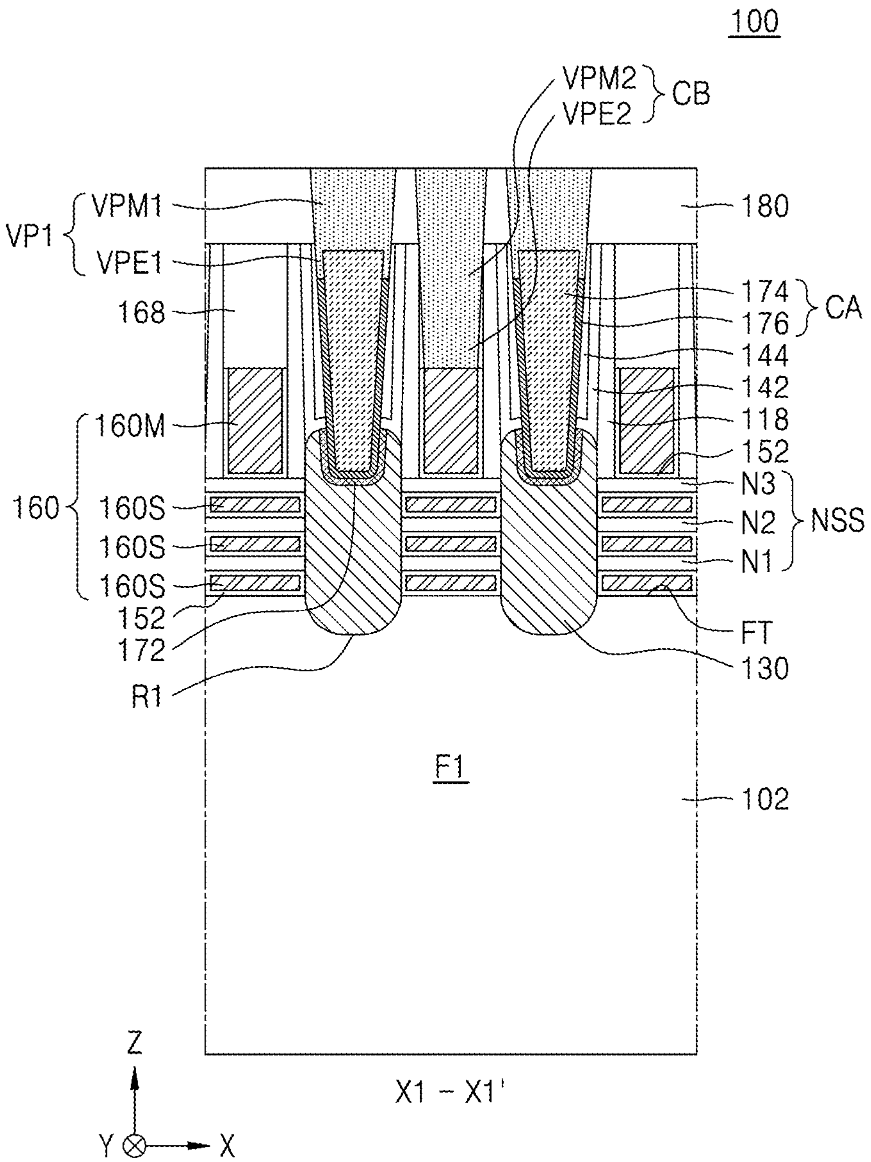
FIG. 2A is a cross-sectional view taken along line X1-X1' of FIG. 1.
Figure 2B:
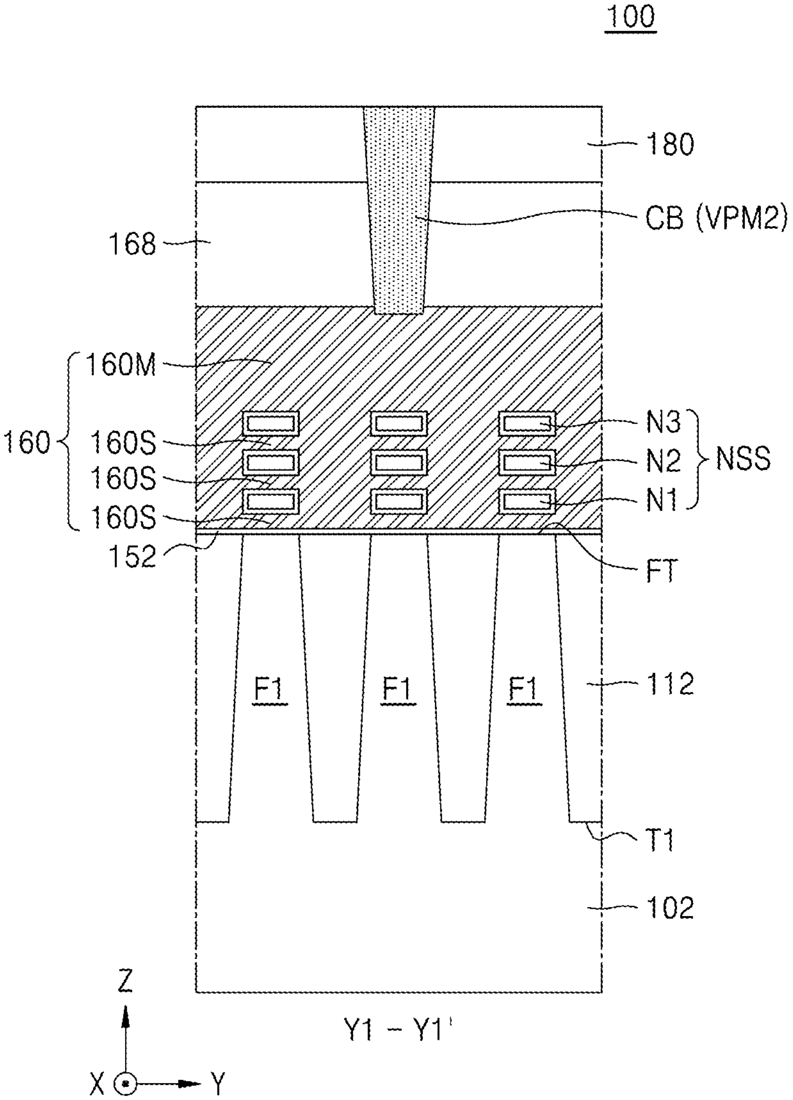
FIG. 2B is a cross-sectional view taken along line Y1-Y1' of FIG. 1.

FIG. 1 is a plan layout diagram showing an integrated circuit device 100 according to embodiments. FIG. 2A is a cross-sectional view taken along line X1-X1' of FIG. 1. FIG. 2B is a cross-sectional view taken along line Y1-Y1' of FIG. 1. Referring to FIGS. 1 to 2B, the integrated circuit device 100 includes a field effect transistor having a gate-all-around structure including an active region having the shape of a nanowire or a nano-sheet and a gate surrounding the active region.

Referring to FIGS. 1 to 2B, the integrated circuit device 100 may include a plurality of fin-type active regions F1 protruding from a substrate 102 and extending long (e.g., lengthwise) in a first horizontal direction (X direction), and a plurality of nano-sheet stacks NSS facing fin top surfaces FT of the plurality of fin-type active regions F1 at a location spaced upward from the plurality of fin-type active regions F1 in the vertical direction (Z direction). The term "nano-sheet" as used herein refers to a conductive structure having a cross-section substantially perpendicular to a direction in which an electric current flows. It should be understood that the nano-sheet includes nanowires.

A trench T1 defining the plurality of fin-type active regions F1 may be formed in the substrate 102, and the trench T1 may be filled with a device isolation layer 112. The substrate 102 may include a semiconductor, e.g., Si or Ge, or a compound semiconductor, e.g., SiGe, SiC, GaAs, InAs, InGaAs, or InP. The terms "SiGe", "SiC", "GaAs", "InAS", "InGaAs", and "InP" as used herein refer to a material composed of elements included in each term and is not a formula representing a stoichiometric relationship. The substrate 102 may include a conductive region, e.g., a well doped with an impurity or a structure doped with an impurity. The device isolation layer 112 may include, e.g., an oxide film, a nitride film, or a combination thereof.

A plurality of gate lines 160 may be arranged on the plurality of fin-type active regions F1. The plurality of gate lines 160 may each extend long (e.g., lengthwise) in a second horizontal direction (Y direction) intersecting with the first horizontal direction (X direction).

In regions where the plurality of fin-type active regions F1 and the plurality of gate lines 160 intersect with each other, the plurality of nano-sheet stacks NSS may be arranged over (e.g., to vertically overlap) the fin top surfaces FT of the plurality of fin-type active regions F1, respectively. The plurality of nano-sheet stacks NSS may each include at least one nano-sheet facing the fin top surface FT at a position spaced apart from the fin top surface FT of the fin-type active region F1 in the vertical direction (Z direction).

As shown in FIGS. 2A and 2B, the plurality of nano-sheet stacks NSS may include a first nano-sheet N1, a second nano-sheet N2, and a third nano-sheet N3 overlapping one another in the vertical direction (Z direction) above the fin-type active region F1. The first nano-sheet N1, the second nano-sheet N2, and the third nano-sheet N3 may be spaced apart from the fin top surface FT of the fin-type active region F1 by different vertical distances (distances in the Z direction). The plurality of gate lines 160 may surround the first nano-sheet N1, the second nano-sheet N2, and the third nano-sheet N3 included in the nano-sheet stacks NSS which overlaps one another in the vertical direction (Z direction).

For example, as illustrated in FIG. 1, the planar shape (e.g., in top view) of the nano-sheet stack NSS may be substantially rectangular. In another example, the nano-sheet stack NSS may have various planar shapes according to the planar shapes of the fin-type active regions F1 and the gate lines 160. The present embodiment shows a configuration in which the nano-sheet stacks NSS and the gate lines 160 are arranged on one fin-type active region F1, and the nano-sheet stacks NSS are arranged in a line in the first direction (X direction) on the one fin-type active region F1. However, any suitable number of nano-sheet stacks NSS and gate lines 160 on one fin-type active region F1 may be implemented.

The first nano-sheet N1, the second nano-sheet N2, and the third nano-sheet N3 included in the nano-sheet stack NSS may each function as a channel region. According to embodiments, the first nano-sheet N1, the second nano-sheet N2, and the third nano-sheet N3 may each have a thickness within a range from about 4 nm to about 6 nm. Here, the thickness of each of the first nano-sheet N1, the second nano-sheet N2, and the third nano-sheet N3 refers to a size in the vertical direction (Z direction). According to embodiments, the first nano-sheet N1, the second nano-sheet N2, and the third nano-sheet N3 may have substantially the same thickness in the vertical direction (Z direction). According to other embodiments, at least some of the first nano-sheet N1, the second nano-sheet N2, and the third nano-sheet N3 may have different thicknesses in the vertical direction (Z direction).

As shown in FIG. 2A, the first nano-sheet N1, the second nano-sheet N2, and the third nano-sheet N3 included in one nano-sheet stack NSS may have the same size or sizes similar to one another in the first horizontal direction (X direction). According to other embodiments, unlike as shown in FIG. 2A, at least some of the first nano-sheet N1, the second nano-sheet N2, and the third nano-sheet N3 included in one nano-sheet stack NSS may have different sizes in the first horizontal direction (X direction).

As shown in FIGS. 2A and 2B, the plurality of gate lines 160 may each include a main gate portion 160M and a plurality of sub-gate portions 160S. The main gate portion 160M may cover the top surface of the nano-sheet stack NSS and extend long (e.g., lengthwise) in the second horizontal direction (Y direction). The plurality of sub-gate portions 160S may be integrally connected to the main gate portion 160M and may each be disposed between adjacent ones of the first nano-sheet N1, the second nano-sheet N2, and the third nano-sheet N3, and between the first nano-sheet N1 and the fin-type active region F1. In the vertical direction (Z direction), the thickness of each of the plurality of sub-gate portions 160S may be less than that of the main gate portion 160M.

As shown in FIG. 2A, a plurality of recesses R1 may be formed in the fin-type active region F1. The vertical level of the lowermost surface of each of the plurality of recesses R1 may be lower than the vertical level of the fin top surface FT of the fin-type active region F1. The term "vertical level" as used herein refers to a distance in the vertical direction (Z direction or −Z direction) from a main surface (e.g., a bottom surface) of the substrate 102.

As shown in FIG. 2A, a plurality of source/drain regions 130 may be arranged in the plurality of recesses R1, respectively. The plurality of source/drain regions 130 may each be disposed adjacent to at least one gate line 160 selected from among the plurality of gate lines 160. The plurality of source/drain regions 130 may have surfaces facing the first nano-sheet N1, the second nano-sheet N2, and the third nano-sheet N3 included in the adjacent nano-sheet stack NSS, respectively. The plurality of source/drain regions 130 may contact (e.g., directly contact) the first nano-sheet N1, the second nano-sheet N2, and the third nano-sheet N3 included in the adjacent nano-sheet stack NSS, respectively.

The plurality of gate lines 160 may each include a metal, a metal nitride, a metal carbide, or a combination thereof. The metal may be at least one of, e.g., Ti, W, Ru, Nb, Mo, Hf, Ni, Co, Pt, Yb, Tb, Dy, Er, and Pd. The metal nitride may be selected from, e.g., TiN and TaN. The metal carbide may be, e.g., TiAlC.

A gate dielectric layer 152 may be disposed between the nano-sheet stack NSS and the gate line 160. According to embodiments, the gate dielectric layer 152 may include a stacked structure of an interfacial dielectric layer and a high-k layer. The interfacial dielectric layer may include a low-k material layer having a dielectric constant of about 9 or less, e.g., a silicon oxide layer, a silicon oxynitride layer, or a combination thereof. According to embodiments, the interfacial dielectric layer may be omitted. The high-k layer may include a material having a higher dielectric constant than that of a silicon oxide layer. For example, the high-k layer may have a dielectric constant from about 10 to about 25. The high-k layer may include, e.g., hafnium oxide.

As shown in FIGS. 2A and 2B, top surfaces of the gate dielectric layer 152 and the gate line 160 may be covered by a capping insulation pattern 168. The capping insulation pattern 168 may include, e.g., a silicon nitride layer.

Both, e.g., opposite, sidewalls of each of the gate line 160 and the capping insulation pattern 168 may be covered by an outer insulation spacer 118. The outer insulation spacer 118 may cover both sidewalls of the main gate portion 160M on top surfaces of the plurality of nano-sheet stacks NSS. The outer insulation spacer 118 may be spaced apart from the gate line 160 with the gate dielectric layer 152 therebetween. The outer insulation spacer 118 may include, e.g., silicon nitride, silicon oxide, SiCN, SiBN, SION, SiOCN, SiBCN, SiOC, or a combination thereof. The terms "SiCN", "SiBN", "SiON", "SiOCN", "SiBCN", and "SiOC" as used herein refer to a material composed of elements included in each term and is not a formula representing a stoichiometric relationship.

A plurality of outer insulation spacers 118 and the plurality of source/drain regions 130 on the substrate 102 may be covered by an insulation liner 142. The insulation liner 142 may include, e.g., silicon nitride (SiN), silicon oxide (SiO), SiCN, SiBN, SiON, SiOCN, SiBCN, SiOC, or a combination thereof. According to embodiments, the insulation liner 142 may be omitted. An inter-gate insulation layer 144 may be disposed on the insulation liner 142. The inter-gate insulation layer 144 may include, e.g., a silicon nitride layer, a silicon oxide layer, a SiON layer, a SiOCN layer, or a combination thereof. When the insulation liner 142 is omitted, the inter-gate insulation layer 144 may contact the plurality of source/drain regions 130.

Both sidewalls of each of the plurality of sub-gate portions 160S may be spaced apart from the source/drain region 130 with the gate dielectric layer 152 therebetween. The gate dielectric layer 152 may be disposed between a sub-gate portion 160S included in the gate line 160 and each of the first nano-sheet N1, the second nano-sheet N2, and the third nano-sheet N3 and between the sub-gate portion 160S included in the gate line 160 and the source/drain region 130.

The nanosheet stacks NSS are arranged on the fin top surfaces FT of the fin-type active regions F1 in regions where the fin-type active regions F1 and the gate lines 160 intersect each other and may face the fin top surfaces FT of the fin-type active regions F1 at locations spaced apart from the fin-type active regions F1. A plurality of nanosheet transistors may be formed on the substrate 102 at the intersections between the fin-type active regions F1 and the gate lines 160.

Although FIG. 1 shows a case in which the planar shape of the nanosheet stack NSS is substantially rectangular. The nano-sheet stack NSS may have various planar shapes according to the planar shapes of the fin-type active regions F1 and the gate lines 160. The present embodiment shows a configuration in which the nano-sheet stacks NSS and the gate lines 160 are formed on one fin-type active region F1, and the nano-sheet stacks NSS are arranged in a line in the first direction (X direction) on the one fin-type active region F1. However, the number of nano-sheet stacks NSS arranged on the one fin-type active region F1 is not particularly limited, e.g., one nanosheet stack NSS may be formed on the one fin-type active region F1. Although the present embodiment exemplifies a case where one nano-sheet stack NSS includes three nano-sheets, embodiments may include any suitable number of stacks and nano-sheets therein, e.g., the nano-sheet stack NSS may include at least two nano-sheets.

The first nano-sheet N1, the second nano-sheet N2, and the third nano-sheet N3 included in the nano-sheet stack NSS may each include a channel region. According to embodiments, the first nano-sheet N1, the second nano-sheet N2, and the third nano-sheet N3 included in the nano-sheet stack NSS may each include a Si layer, a SiGe layer, or a combination thereof.

A metal silicide layer 172 may be formed on the top surface of each of the plurality of source/drain regions 130. The metal silicide layer 172 may include a metal including, e.g., Ti, W, Ru, Nb, Mo, Hf, Ni, Co, Pt, Yb, Tb, Dy, Er, or Pd. For example, the metal silicide layer 172 may include titanium silicide, but is not limited thereto.

The insulation liner 142 and the inter-gate insulation layer 144 may be sequentially arranged on the plurality of source/drain regions 130 and a plurality of metal silicide layers 172. The insulation liner 142 and the inter-gate insulation layer 144 may constitute an insulation structure. According to embodiments, the insulation liner 142 may include, e.g., silicon nitride (SiN), SiCN, SiBN, SION, SiOCN, SiBCN, or a combination thereof. The inter-gate insulation layer 144 may include, e.g., a silicon oxide film.

A plurality of source/drain contacts CA may be respectively arranged on the plurality of source/drain regions 130. The plurality of source/drain contacts CA may each penetrate through the inter-gate insulation layer 144 and the insulation liner 142 in the vertical direction (Z direction) and contact the metal silicide layer 172. The plurality of source/drain contacts CA may be configured to be electrically connectable to the source/drain regions 130 through the metal silicide layer 172. The plurality of source/drain contacts CA may each be spaced apart from the main gate portion 160M in the first horizontal direction (X direction) with the outer insulation spacer 118 therebetween. Here, some of the plurality of source/drain contacts CA may correspond to dummy contacts.

A dummy contact may be disposed adjacent to a gate contact CB. A plurality of dummy contacts may be provided around the gate contact CB. The plurality of dummy contacts may be arranged in a closed loop-like shape surrounding the gate contact CB.

The dummy contact may have the same shape as the gate contact CB when viewed from above. For example, the gate contact CB and the dummy contact may have a rectangular shape or a circular shape, as shown in FIG. 1, when viewed from above. The planar area of the dummy contact may be substantially the same as that of the gate contact CB. The dummy contact may include the same material as the gate contact CB. For example, the gate contact CB and the dummy contact may include at least one of a metal and a metal silicide.

The plurality of source/drain contacts CA may each include a contact plug 174 and a conductive barrier pattern 176. In this specification, the contact plug 174 may be referred to as a first conductive pattern and the conductive barrier pattern 176 may be referred to as a second conductive pattern. According to embodiments, the conductive barrier pattern 176 may include a metal, e.g., at least one of molybdenum (Mo), copper (Cu), tungsten (W), cobalt (Co), ruthenium (Ru), manganese (Mn), titanium (Ti), tantalum (Ta), aluminum (Al), and combinations thereof. The conductive barrier pattern 176 may include a metal or a metal nitride, e.g., at least one of Ti, Ta, W, TiN, TaN, WN, WCN, TiSiN, TaSiN, WSiN, or a combination thereof.

The contact plug 174 may penetrate through the inter-gate insulation layer 144 and the insulation liner 142 and extend long (e.g., lengthwise) in the vertical direction (Z direction). The conductive barrier pattern 176 may be disposed, e.g., directly, between the metal silicide layer 172 and the contact plug 174. The conductive barrier pattern 176 may have a surface contacting the metal silicide layer 172 and a surface contacting the contact plug 174.

As shown in FIGS. 2A and 2B, top surfaces of each of the plurality of source/drain contacts CA and a plurality of capping insulation patterns 168 may be covered by an upper insulation structure 180. The upper insulation structure 180 may be formed on the plurality of source/drain contacts CA and the capping insulation pattern 168. The upper insulation structure 180 may include, e.g., an oxide film, a nitride film, an ultra-low-k (ULK) film having an ultra-low dielectric constant k from about 2.2 to about 2.4, or a combination thereof. For example, the upper insulation structure 180 may include a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof.

As shown in FIGS. 1 and 2A, a plurality of via contacts VP1 may be respectively arranged on the plurality of source/drain contacts CA, respectively. The plurality of via contacts VP1 may penetrate through the upper insulation structure 180 and contact the plurality of source/drain contacts CA, respectively. In this specification, a via contact VP1 may be referred to as an upper conductive pattern or a first upper conductive pattern. The plurality of source/drain regions 130 may be configured to be electrically connectable to the via contacts VP1 through the metal silicide layer 172 and the source/drain contacts CA, respectively. Bottom surfaces of the plurality of via contacts VP1 may contact top surfaces of the plurality of source/drain contacts CA, respectively. The plurality of via contacts VP1 may each include, e.g., Mo or W.

As shown in FIGS. 1, 2A, and 2B, the gate contact CB may be disposed on the gate line 160. The gate contact CB may be configured to penetrate through the upper insulation structure 180 in the vertical direction (Z direction) and be connected to the gate line 160. The bottom surface of the gate contact CB may contact the top surface of the gate line 160. In this specification, the gate contact CB may be referred to as an upper conductive pattern or a second upper conductive pattern. According to embodiments, the gate contact CB may include, e.g., Mo or W.

As shown in FIG. 2A, the conductive barrier pattern 176 may cover lower portions of sidewalls of the source/drain contact CA at a location where the conductive barrier pattern 176 contacts the source/drain contact CA and the via contact VP1. The conductive barrier pattern 176 may cover the bottom surface and portions of sidewalls of the contact plug 174 at a location where the conductive barrier pattern 176 contacts the source/drain contact CA and the via contact VP1. The length of the conductive barrier pattern 176 in the vertical direction (Z direction) below the via contact VP1 may be less than the length of the contact plug 174 in the vertical direction (Z direction), e.g., an upper portion of the contact plug 174 may directly contact the via contact VP1.

The via contact VP1 may include a main plug portion VPM1 overlapping each of the contact plug 174 and the conductive barrier pattern 176 of the source/drain contact CA in the vertical direction (Z direction), and a vertical extension VPE1 extending from a portion of the main plug portion VPM1 toward the substrate 102. The vertical extension VPE1 of the via contact VP1 may cover upper portions of the sidewalls of the contact plug 174 and overlap the conductive barrier pattern 176 in the vertical direction (Z direction). The main plug portion VPM1 and the vertical extension VPE1 of the via contact VP1 may be integrally connected to each other and include the same material.

The length from the substrate 102 to the top surface of the contact plug 174 below the via contact VP1 in the vertical direction (Z direction) may be greater than the length from the substrate 102 to the uppermost surface of the conductive barrier pattern 176. For example, as shown in FIG. 2A, the length from the fin top surface FT of the fin-type active region F1 to the uppermost surface of the contact plug 174 in the vertical direction (Z direction) may be greater than the length from the fin top surfaces FT of the fin-type active region F1 to the uppermost surface of the conductive barrier pattern 176. As shown in FIG. 2A, the contact plug 174 may include a top portion protruding more than, e.g., above, the conductive barrier pattern 176 in a direction oriented away from the substrate 102. The top portion of the contact plug 174 may be accommodated in a space defined by the vertical extension VPE1 of the via contact VP1.

The via contact VP1 may contact portions of the contact plug 174 and the conductive barrier pattern 176. The via contact VP1 may include a portion contacting the top surface of the contact plug 174, a portion contacting the top surface of the conductive barrier pattern 176, and a portion contacting portions of sidewalls of the contact plug 174 not covered by the conductive barrier pattern 176.

The gate contact CB may include a main plug portion VPM2 overlapping the gate line 160 in the vertical direction (Z direction) and a vertical extension VPE2 extending from a portion of the main plug portion VPM2 toward the substrate 102. The main plug portion VPM2 and the vertical extension VPE2 of the gate contact CB may be integrally connected to each other and include the same material.

Figure 3A:
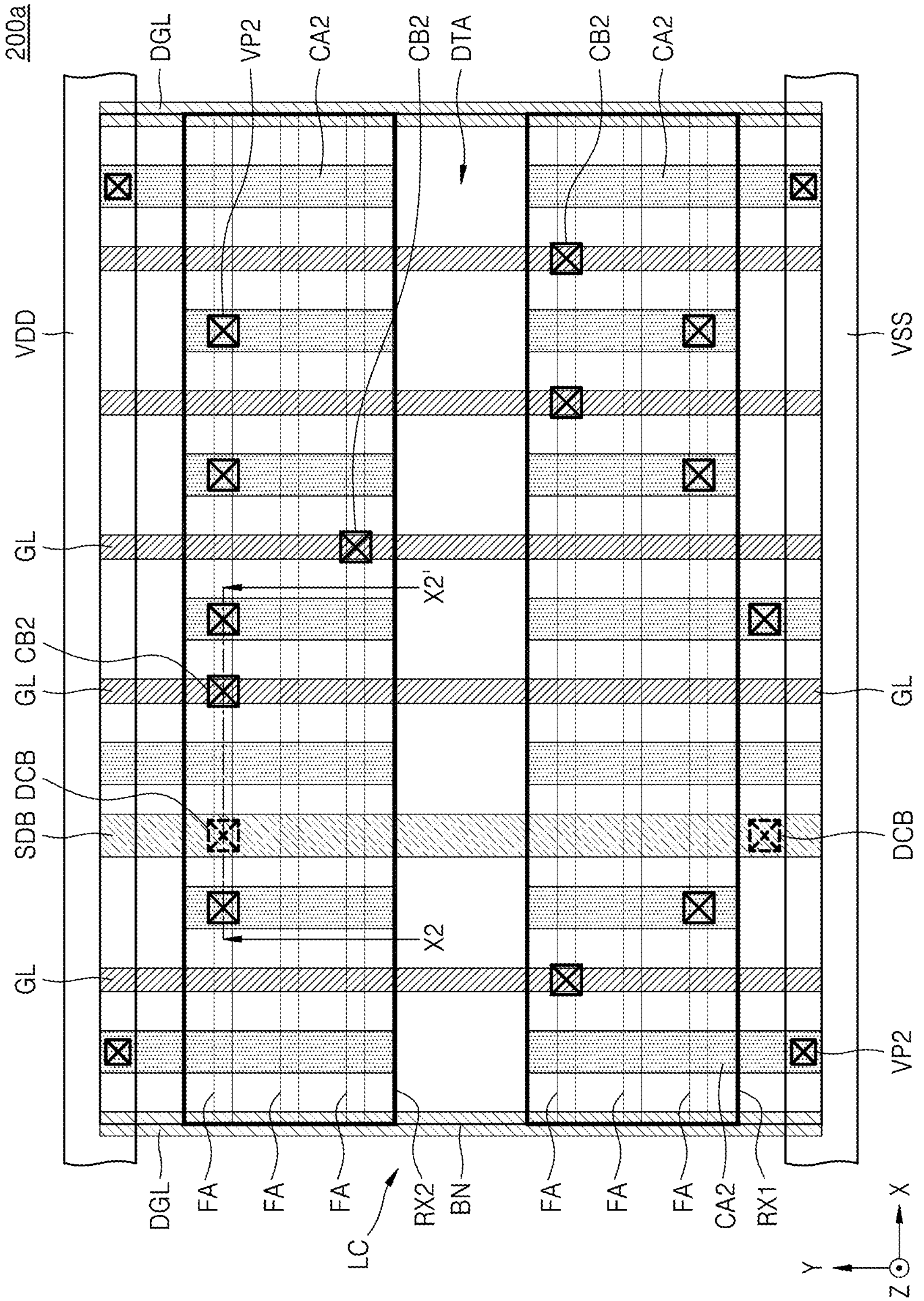
FIG. 3A to 3C are plan layout diagrams of an integrated circuit device according to embodiments.
Figure 3B:
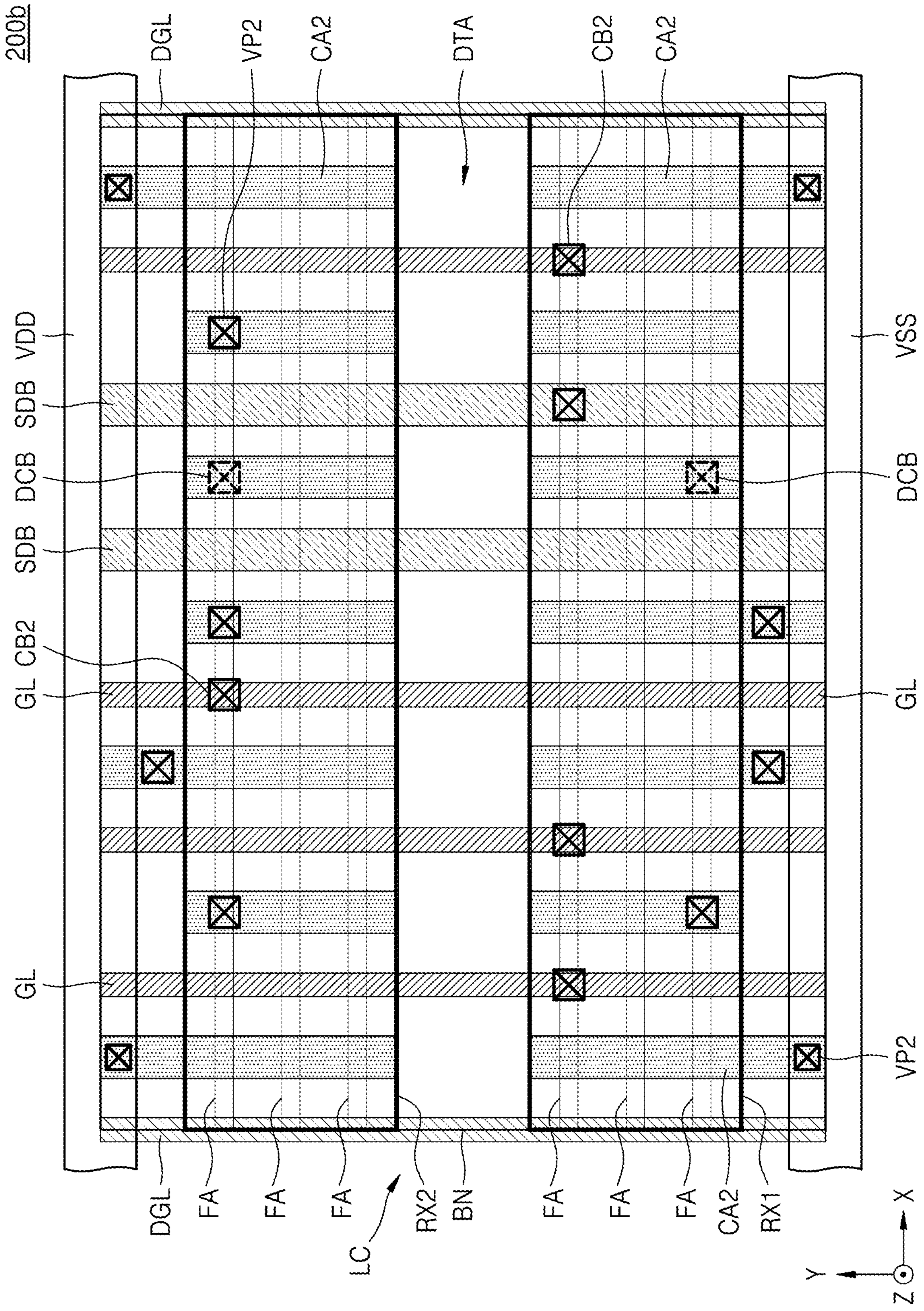
Figure 3C:
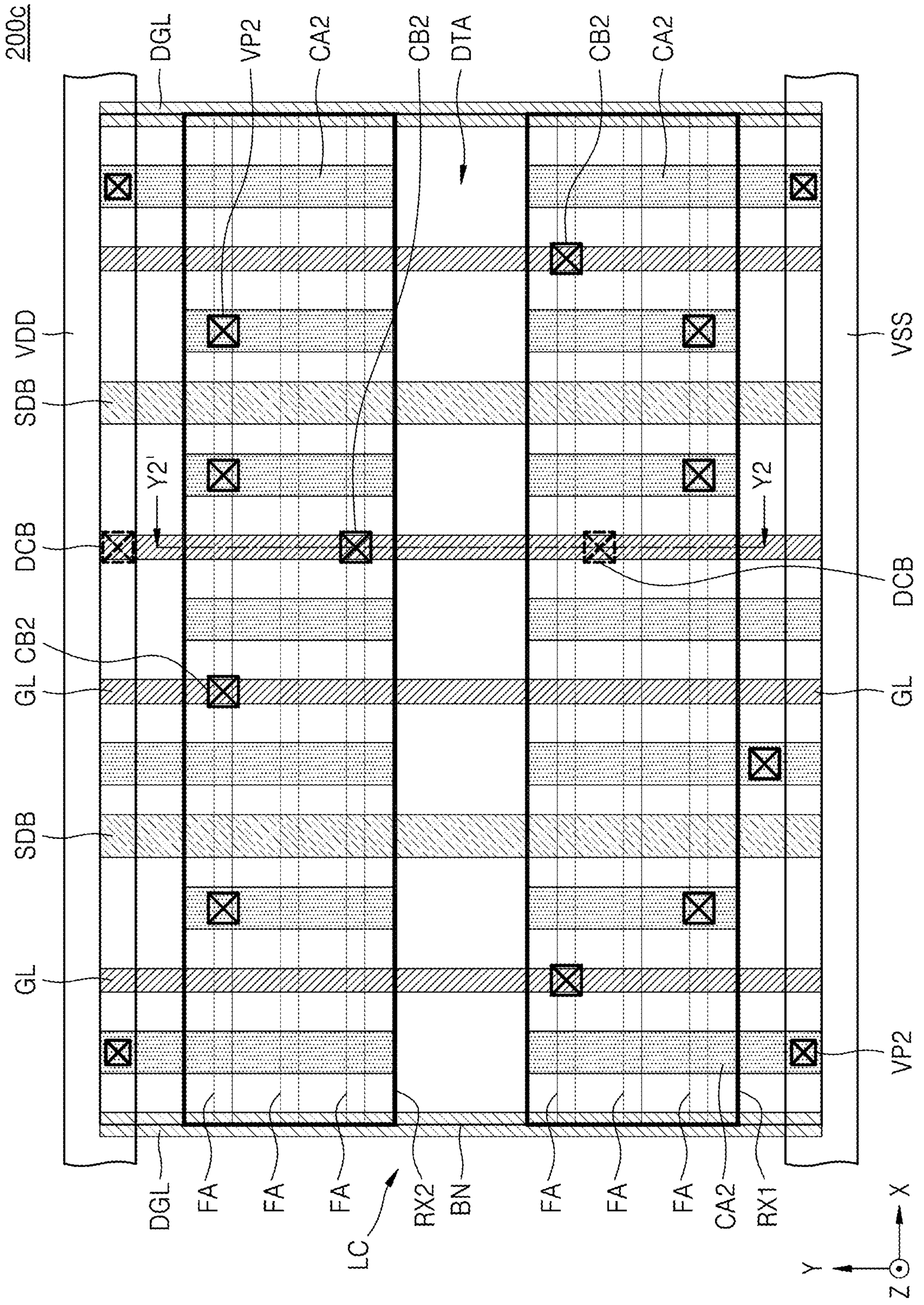
Figure 4A:
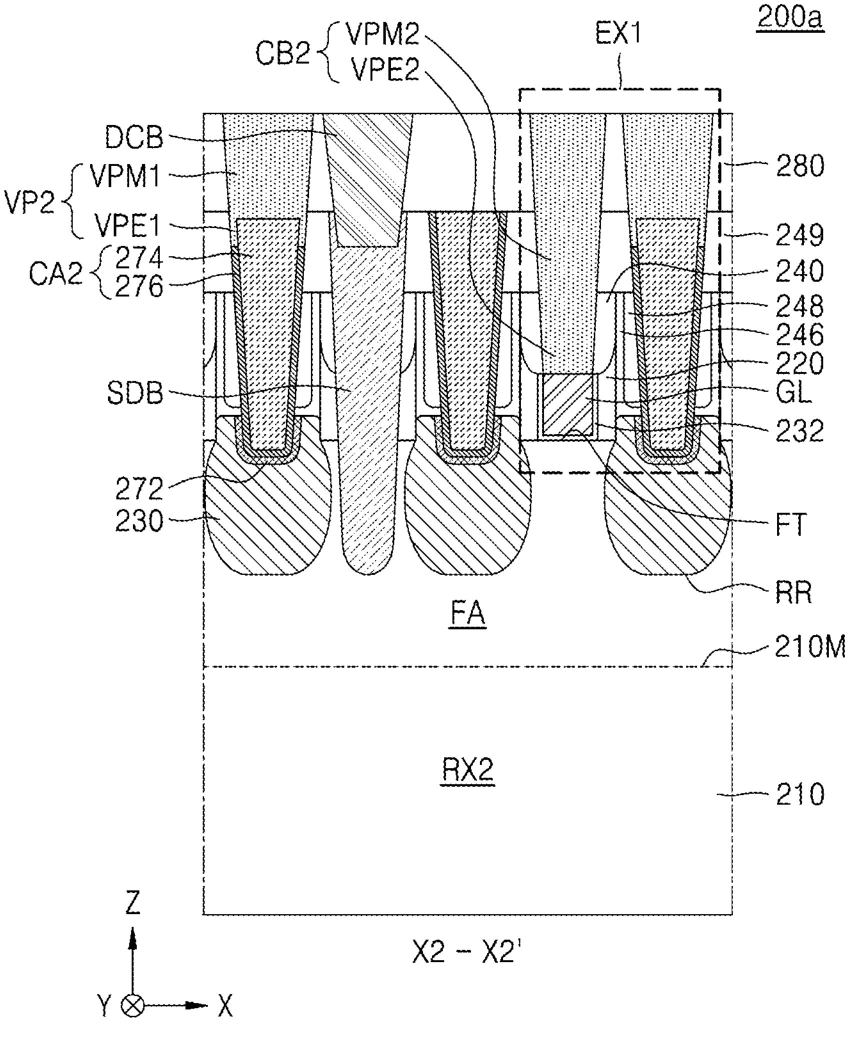
FIG. 4A is a partial cross-sectional view taken along line X3-X3' of FIG. 3A.
Figure 4B:
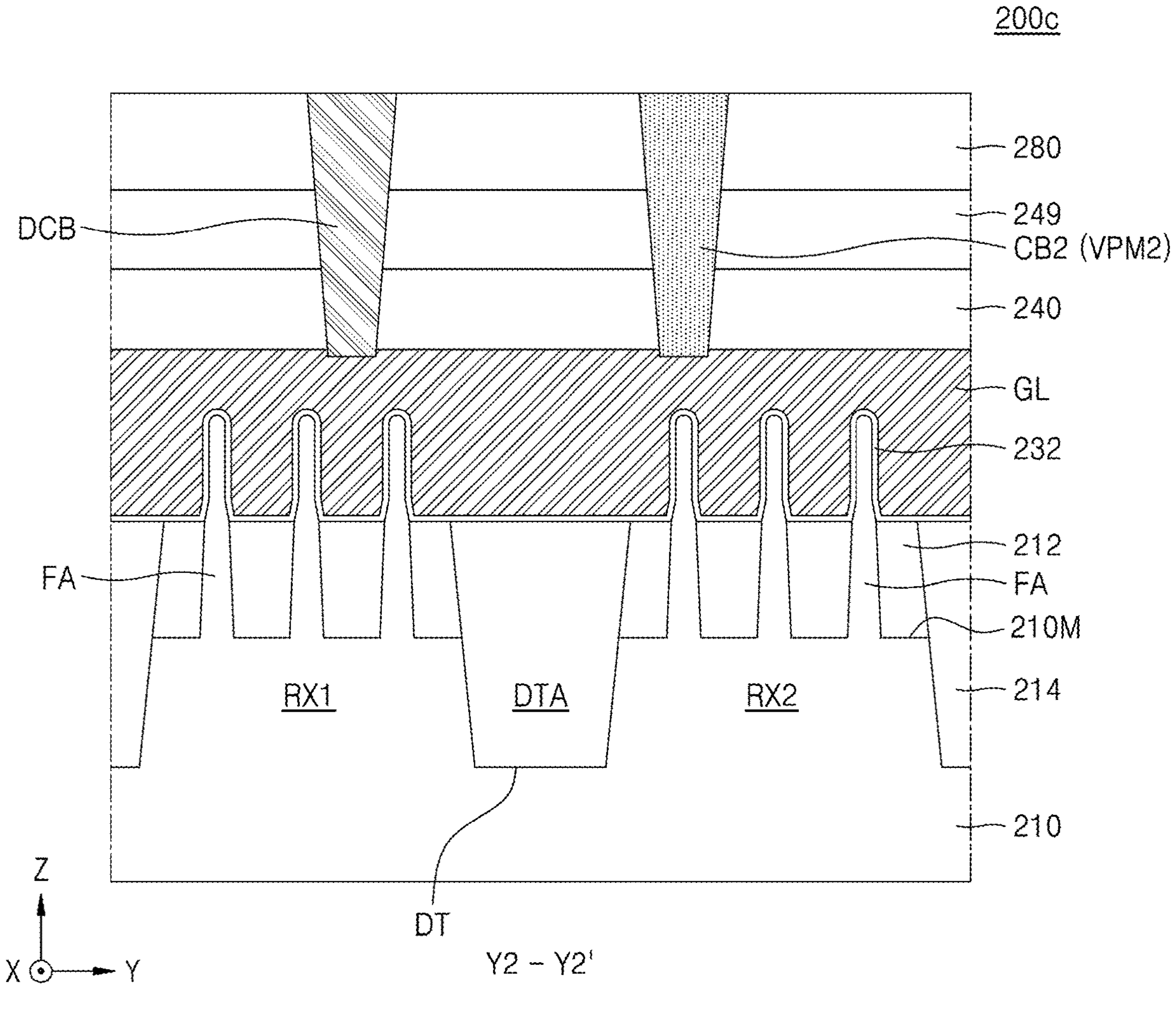
FIG. 4B is a partial cross-sectional view taken along line Y3-Y3' of FIG. 3C.
Figure 4C:
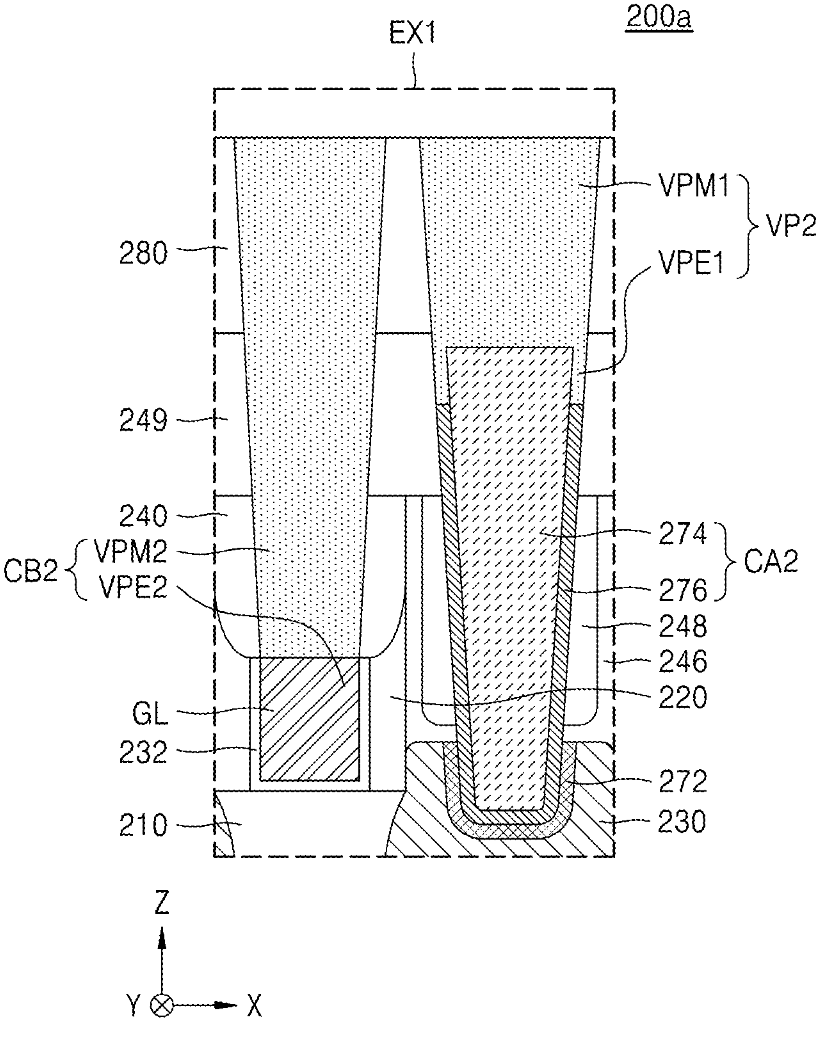
FIG. 4C is an enlarged cross-sectional view of portion "EX1" of FIG. 4A.

FIGS. 3A to 3C are planar layout diagrams for describing integrated circuit devices 200*a*, 200*b*, and 200*c* according to other embodiments. FIG. 4A is a partial cross-sectional view taken along line X3-X3' of FIG. 3A, FIG. 4B is a partial cross-sectional view taken along line Y3-Y3' of FIG. 3C, and FIG. 4C is an enlarged cross-sectional view of a portion "EX1" of FIG. 4A.

Referring to FIGS. 3A to 3C and 4A to 4C, the integrated circuit devices 200*a*, 200*b*, and 200*c* may constitute a logic cell including a fin field effect transistor (FinFET) device. The integrated circuit devices 200*a*, 200*b*, and 200*c* may each include a logic cell LC formed in a region defined by a cell boundary BN on a substrate 210.

The substrate 210 may have a main surface 210M extending in horizontal directions (X-Y plane-wise direction). The substrate 210 may have substantially the same configuration as that described for the substrate 102 with reference to FIGS. 2A and 2B.

The logic cell LC may include a first device region RX1 and a second device region RX2. A plurality of fin-type active regions FA protruding from the substrate 210 may be arranged in the first device region RX1 and the second device region RX2. The fin-type active regions FA may extend parallel to one another in a width-wise direction of the logic cell LC, i.e., in a first horizontal direction (X direction).

As shown in FIG. 4B, in the first device region RX1 and the second device region RX2, a device isolation layer 212 may be disposed on the substrate 210. The device isolation layer 212 may be disposed between the plurality of fin-type active regions FA and may cover lower sidewalls of the plurality of fin-type active regions FA. In the first device region RX1 and the second device region RX2, the fin-type active regions FA may protrude above the device isolation layer 212 in fin-like shapes. An inter-device isolation region DTA may be disposed between the first device region RX1 and the second device region RX2. In the inter-device isolation region DTA, a deep trench DT defining the first device region RX1 and the second device region RX2 is formed, and the deep trench DT may be filled with an inter-device isolating insulation layer 214. The device isolation layer 212 and the inter-device isolating insulation layer 214 may each include an oxide film.

On the substrate 210, a plurality of gate dielectric layers 232 and a plurality of gate lines GL may extend in the heightwise direction of the logic cell LC (e.g., I the Z direction) crossing the plurality of fin-type active regions FA (i.e., in the second horizontal direction (Y direction)). The plurality of gate dielectric layers 232 and the plurality of gate lines GL may cover the top surface and both sidewalls of each of the fin-type active regions FA, the top surface of the device isolation layer 212, and the top surface of the inter-device isolating insulation layer 214.

A plurality of MOS transistors may be formed along the plurality of gate lines GL in the first device region RX1 and the second device region RX2. The MOS transistors may each be a MOS transistors having a three-dimensional (3D) structure in which channels are formed on top surfaces and both sidewalls of the fin-type active regions FA, respectively. In example embodiments, the first device region RX1 may be an NMOS transistor region, and a plurality of NMOS transistors may be formed in portions of the first device region RX1 where the fin-type active regions FA and the gate lines GL intersect each other. The second device region RX2 may be a PMOS transistor region, and a plurality of PMOS transistors may be formed in portions of the second device region RX2 where the fin-type active regions FA and the gate lines GL intersect each other.

A dummy gate line DGL may extend along a portion of the cell boundary BN extending in the second horizontal direction (Y direction). The dummy gate line DGL may include the same material as the plurality of gate lines GL. The dummy gate line DGL may maintain an electrically floated state during the operation of the integrated circuit device 100, and thus the dummy gate line DGL may function as an electrical isolation region between the logic cell LC and other logic cells around the logic cell LC. The plurality of gate lines GL and a plurality of dummy gate lines DGL may have the same width in the first horizontal direction (X direction) and may be arranged at a constant pitch in the first horizontal direction (X direction).

The plurality of gate dielectric layers 232 may include, e.g., silicon oxide films, high-k layers, or a combination thereof. The high-k layer may include a material having a higher dielectric constant than that of a silicon oxide layer. The high-k layer may include, e.g., a metal oxide or a metal oxynitride. An interfacial layer may be between the fin-type active region FA and a gate dielectric layer 232. The interfacial layer may include, e.g., an oxide film, a nitride film, or an oxynitride film.

The plurality of gate lines GL and the plurality of dummy gate lines DGL may each have a structure in which a metal nitride layer, a metal layer, a conductive capping layer, and a gap-fill metal layer are sequentially stacked. The metal nitride layer and the metal layer may include at least one of, e.g., Ti, Ta, W, Ru, niobium (Nb), Mo, and hafnium (Hf). The gap-fill metal layer may include, e.g., a W layer or an Al layer. The gate lines GL and the dummy gate lines DGL may each include a work function metal-containing layer. The work function metal-containing layer may include at least one metal of, e.g., Ti, W, Ru, Nb, Mo, Hf, nickel (Ni), Co, platinum (Pt), ytterbium (Yb), terbium (Tb), dysprosium (Dy), erbium (Er), and palladium (Pd). In example embodiments, the plurality of gate lines GL and the plurality of dummy gate lines DGL may each have a stacked structure of, e.g., TiAlC/TiN/W, a stacked structure of TiN/TaN/TiAlC/TiN/W, or a stacked structure of TiN/TaN/TiN/TiAlC/TiN/W.

A plurality of insulation spacers 220 may cover both sidewalls of the plurality of gate lines GL and the plurality of dummy gate lines DGL. The plurality of gate lines GL, the plurality of dummy gate lines DGL, the plurality of gate dielectric layers 232, and the plurality of insulation spacers 220 may be covered by an insulation capping line 240. The insulation capping line 240 and the plurality of insulation spacers 220 may each extend in a line-like shape in the second horizontal direction (Y direction).

The plurality of insulation spacers 220 may each include, e.g., silicon nitride (SiN), SiCN, SiBN, SiON, SiOCN, SiBCN, or a combination thereof. A plurality of insulation capping lines 240 may include, e.g., SiN.

A plurality of recess regions RR may be formed in the top surfaces of the plurality of fin-type active regions FA. A plurality of source/drain regions 230 may be respectively arranged in the plurality of recess regions RR. The gate line GL and a source/drain region 230 may be spaced apart from each other with the gate dielectric layer 232 and an insulation spacer 220 therebetween.

The plurality of source/drain regions 230 may include epitaxial semiconductor layers epitaxially grown from the plurality of recess regions RR. For example, the plurality of source/drain regions 230 may include an epitaxially grown Si layer, an epitaxially grown SiC layer, or a plurality of epitaxially grown SiGe layers. When the first device region RX1 is an NMOS transistor region and the second device region RX2 is a PMOS transistor region, the plurality of source/drain regions 230 in the first device region RX1 may include a Si layer doped with an n-type dopant or a SiC layer doped with an n-type dopant, and the plurality of source/drain regions 230 in the second device region RX2 may include a SiGe layer doped with a p-type dopant. The n-type dopant may be, e.g., at least one of phosphorus (P), arsenic As), and antimony (Sb). The p-type dopant may be, e.g., at least one of boron (B) and gallium (Ga).

According to embodiments, the plurality of source/drain regions 230 in the first device region RX1 and the plurality of source/drain regions 230 in the second device region RX2 may have different shapes and sizes.

A plurality of metal silicide layers 272 may be respectively arranged on the plurality of source/drain regions 230. A metal silicide layer 272 may have the same configuration as the metal silicide layer 172 described with reference to FIG. 2A.

An insulation liner 246 and an inter-gate insulation layer 248 may be sequentially arranged on the plurality of source/drain regions 230 and the plurality of metal silicide layers 272. The insulation liner 246 and the inter-gate insulation layer 248 may constitute an insulation structure. According to embodiments, the insulation liner 246 may include, e.g., silicon nitride (SiN), SiCN, SiBN, SiON, SiOCN, SiBCN, or a combination thereof. The inter-gate insulation layer 248 may include, e.g., a silicon oxide film.

A plurality of source/drain contacts CA2 may each be configured to penetrate through the inter-gate insulation layer 248 and the insulation liner 246 in the vertical direction (Z direction) and be connected to the source/drain region 230 through the metal silicide layer 272. The source/drain contacts CA2 may be spaced apart from the gate lines GL in the first direction (X direction) across the insulation spacers 220. The plurality of source/drain regions 230 may be connected to via contacts VP2 through the metal silicide layer 272 and the source/drain contacts CA2, respectively.

The plurality of source/drain contacts CA2 may each include a contact plug 274 and a conductive barrier pattern 276 surrounding and contacting the bottom surface and sidewalls of the contact plug 274. Detailed configurations of the contact plug 274 and the conductive barrier pattern 276 are the same as those of the contact plug 174 and the conductive barrier pattern 176 described with reference to FIG. 2A.

A dummy contact DCB may be disposed adjacent to a gate contact CB2. A plurality of dummy contacts DCB may be provided around the gate contact CB2, e.g., the gate contact CB2 may be positioned between two dummy contacts DCB along at least one of the gate lines GL (FIG. 3C). The plurality of dummy contacts DCB may be arranged in a closed loop-like shape surrounding the gate contact CB2, e.g., the gate contact CB2 may be positioned on a gate line GL among a plurality of dummy contacts DCB adjacent to the gate line GL (FIG. 3B).

The dummy contact DCB may have the same shape as the gate contact CB2 or the source/drain contact CA2 when viewed from above. For example, the gate contact CB2 and the dummy contact DCB may have a rectangular shape or a circular shape, as shown in FIGS. 3A to 3C, when viewed from above. The planar area of the dummy contact DCB may be substantially the same as that of the gate contact CB2. The dummy contact DCB may include the same material as the gate contact CB2. For example, the gate contact CB2 and the dummy contact DCB may include at least one of a metal and a metal silicide.

The integrated circuit devices 200*a*, 200*b*, and 200*c* may each include an insulation layer 249 covering top surfaces of the plurality of source/drain contacts CA2 and top surfaces of the plurality of insulation capping lines 240. The plurality of source/drain contacts CA2 may each penetrate through the insulation layer 249 in the vertical direction (Z direction). According to embodiments, the insulation layer 249 may include a silicon oxide film.

As shown in FIGS. 4A and 4B, top surfaces of the insulation layer 249 and the plurality of source/drain contacts CA2 may be covered by an upper insulation structure 280. The plurality of via contacts VP2 may be respectively arranged on the plurality of source/drain contacts CA2. The plurality of via contacts VP2 may penetrate through the upper insulation structure 280 and contact the plurality of source/drain contacts CA2, respectively. The plurality of via contacts VP2 may have the same configuration as the via contact VP1 described above with reference to FIG. 2A.

As shown in FIGS. 3A to 3C and 4A to 4C, a plurality of the gate contacts CB2 may be respectively arranged on the plurality of gate lines GL. The plurality of gate contacts CB2 may penetrate through the upper insulation structure 280, the insulation layer 249, and the insulation capping line 240 and contact the top surfaces of the gate lines GL, respectively. The plurality of gate lines GL may be connected to conductive lines thereabove through the gate contacts CB2. More detailed configurations of the plurality of gate contacts CB2 are the same as those given above for the gate contact CB with reference to FIGS. 2A and 2B.

As shown in FIGS. 3A to 3C, in the logic cell LC, a ground line VSS may be connected to the fin-type active region FA in the first device region RX1 through a source/drain contact CA2 in the first device region RX1 from among the plurality of the source/drain contacts CA2, and a power line VDD may be connected to the fin-type active region FA in the second device region RX2 through a source/drain contact CA2 in the second device region RX2 from among the plurality of source/drain contacts CA2. The ground line VSS and the power line VDD may be formed at a level higher than those of the top surfaces of the plurality of source/drain contacts CA2 and the plurality of gate contacts CB2.

Figure 5:
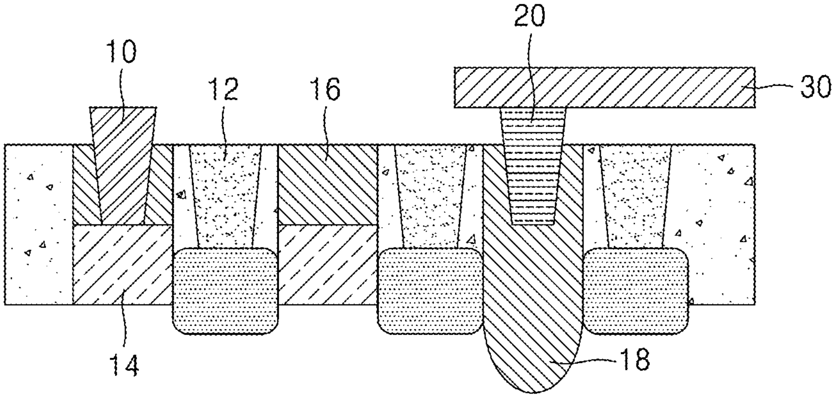
FIGS. 5 to 7 are schematic cross-sectional views of examples of locations where dummy contacts may be formed in an integrated circuit device according to embodiments.
Figure 6:
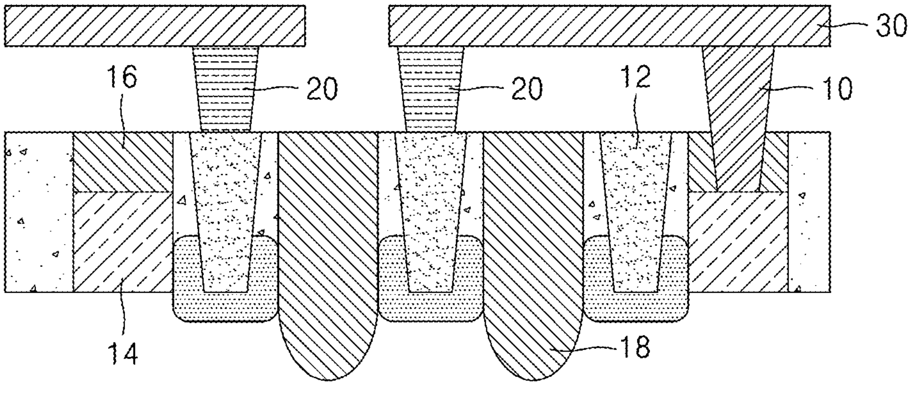
Figure 7:
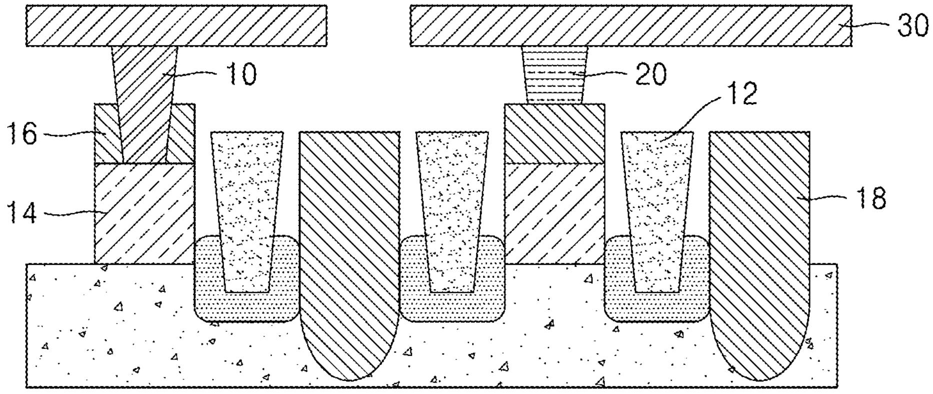

FIGS. 5 to 7 are schematic cross-sectional views of examples of locations where dummy contacts may be formed in an integrated circuit device according to embodiments. FIG. 5 shows a case where a dummy contact 20 is formed in a single diffusion break region 18, FIG. 6 shows a case where the dummy contact 20 is formed on a filler source/drain contact 12, and FIG. 7 shows a case where the dummy contact 20 is formed in a filler wire region 16.

Referring to FIGS. 5 to 7, the dummy contact 20 is not directly and electrically connected to a metal gate 14, and dummy contacts 20 are formed on electrically insulated regions, respectively. Therefore, even when the dummy contact 20 is connected to a metal wire 30 in the same way as a main gate via 10, an integrated circuit device is not degraded.

The dummy contact 20 shown in FIGS. 5 to 7 may correspond to the dummy contact DCB described in this specification. For example, the single diffusion break region 18 in FIGS. 5 to 7 may correspond to a single diffusion break region SDB in FIGS. 3A-3C and 4A, and the metal wire 30 in FIGS. 5 to 7 may correspond to the gate electrode GL in FIGS. 3A-3C and 4A. The single diffusion break region SDB may be adjacent to, e.g., connected to or part of, the source/drain region.

FIGS. 8A to 18 are cross-sectional views of stages in a method of manufacturing an integrated circuit device, according to embodiments. In detail, FIGS. 8A, 9A, 10A, and FIGS. 11 to 18 are cross-sectional views along line X1-X1' of FIG. 1. FIGS. 8B, 9B, and 10B are cross-sectional views along line Y1-Y1' of FIG. 1. An example method of manufacturing the integrated circuit device 100 shown in FIGS. 2A and 2B is described with reference to FIGS. 8A to 18. In FIGS. 8A to 18, the same reference numerals as those in FIGS. 1, 2A, and 2B denote the same members, and detailed descriptions thereof are omitted below.

Figure 8A:
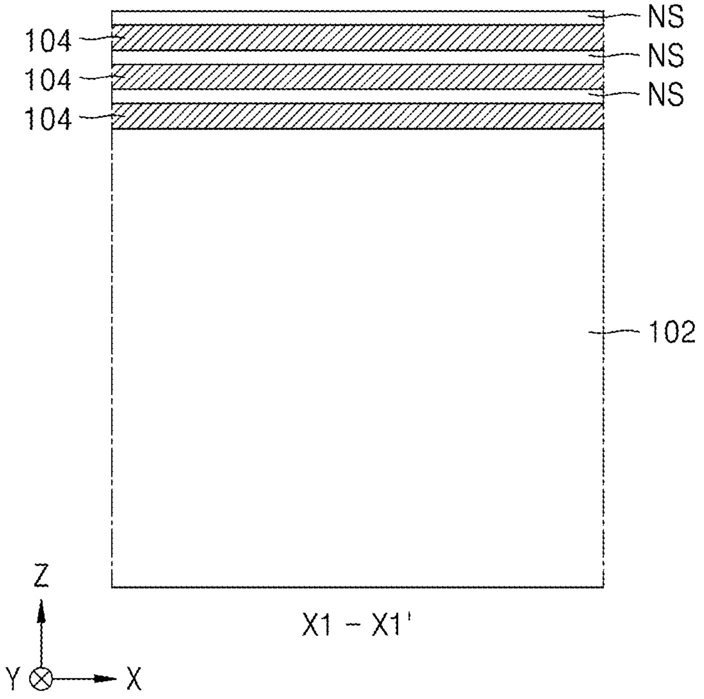
FIGS. 8A to 18 are cross-sectional views of stages in a method of manufacturing an integrated circuit device, according to embodiments.
Figure 8B:
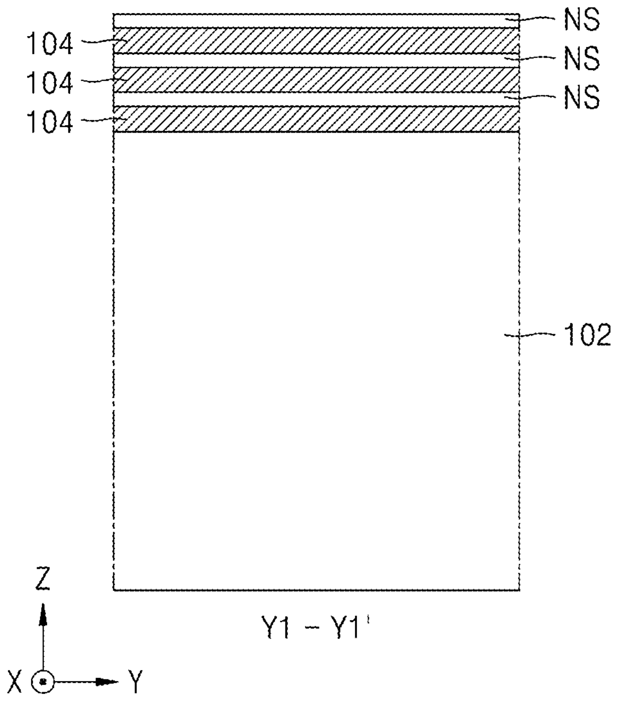

Referring to FIGS. 8A and 8B, a plurality of sacrificial semiconductor layers 104 and a plurality of nano-sheet semiconductor layers NS may be alternately stacked one-by-one on the substrate 102.

The plurality of sacrificial semiconductor layer 104 and the plurality of nano-sheet semiconductor layers NS may include semiconductor materials having different etch selectivity. For example, the plurality of nano-sheet semiconductor layers NS may include Si layers and the plurality of sacrificial semiconductor layers 104 may include SiGe layers. According to embodiments, the Ge concentration in the plurality of sacrificial semiconductor layers 104 may be constant. SiGe layers constituting the plurality of sacrificial semiconductor layers 104 may have a certain Ge concentration selected within the range from about 5 atomic % to about 60 atomic %, e.g., from about 10 atomic % to about 40 atomic %. The Ge concentration in the SiGe layers constituting the plurality of sacrificial semiconductor layers 104 may be variously selected as needed.

Figure 9A:
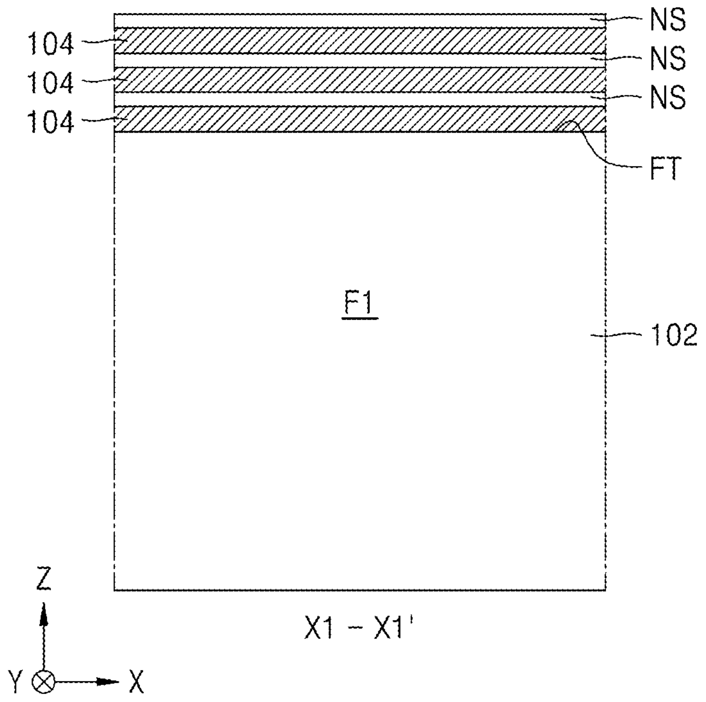
Figure 9B:
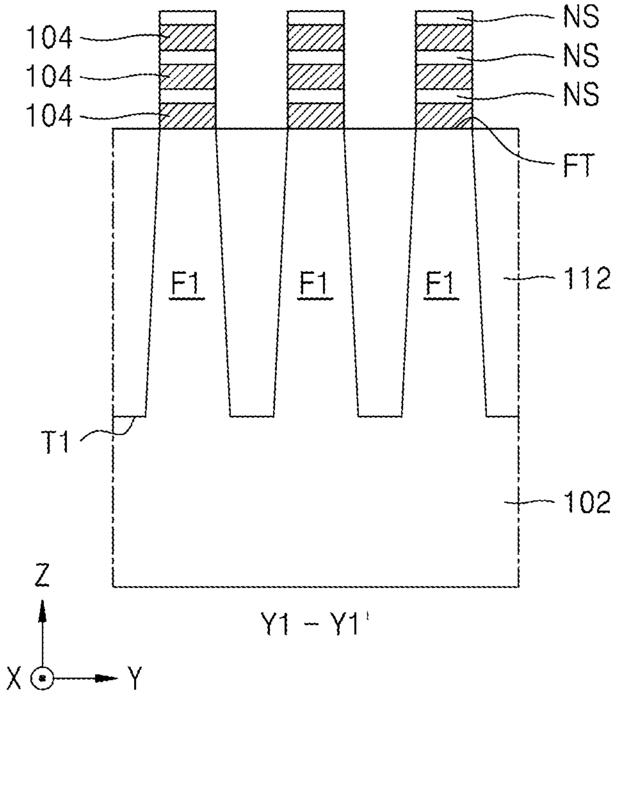

Referring to FIGS. 9A and 9B, the plurality of fin-type active regions F1 may be defined on the substrate 102 by etching the plurality of sacrificial semiconductor layers 104, the plurality of nano-sheet semiconductor layers NS, and a portion of the substrate 102. Thereafter, the device isolation layer 112 covering sidewalls of each of the plurality of fin-type active regions F1 may be formed. A stacked structure of the plurality of sacrificial semiconductor layers 104 and the plurality of nano-sheet semiconductor layers NS may remain on the fin top surface FT of each of the plurality of fin-type active regions F1.

Figure 10A:
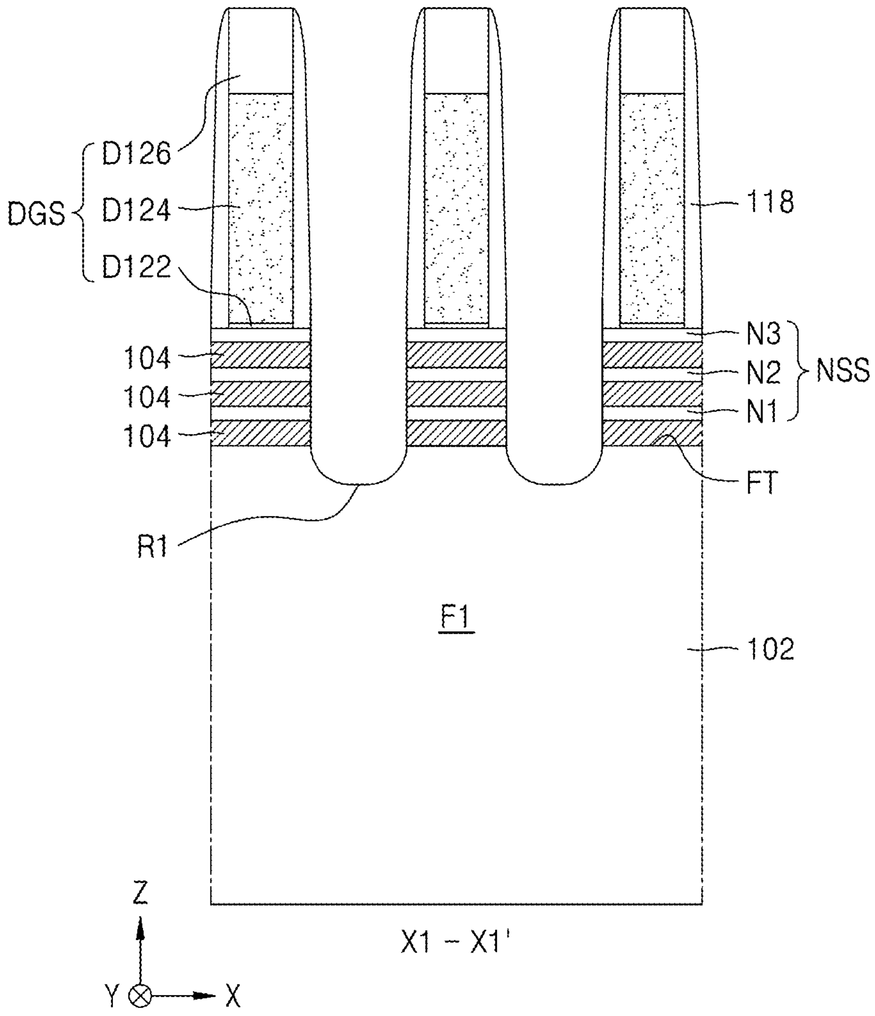
Figure 10B:
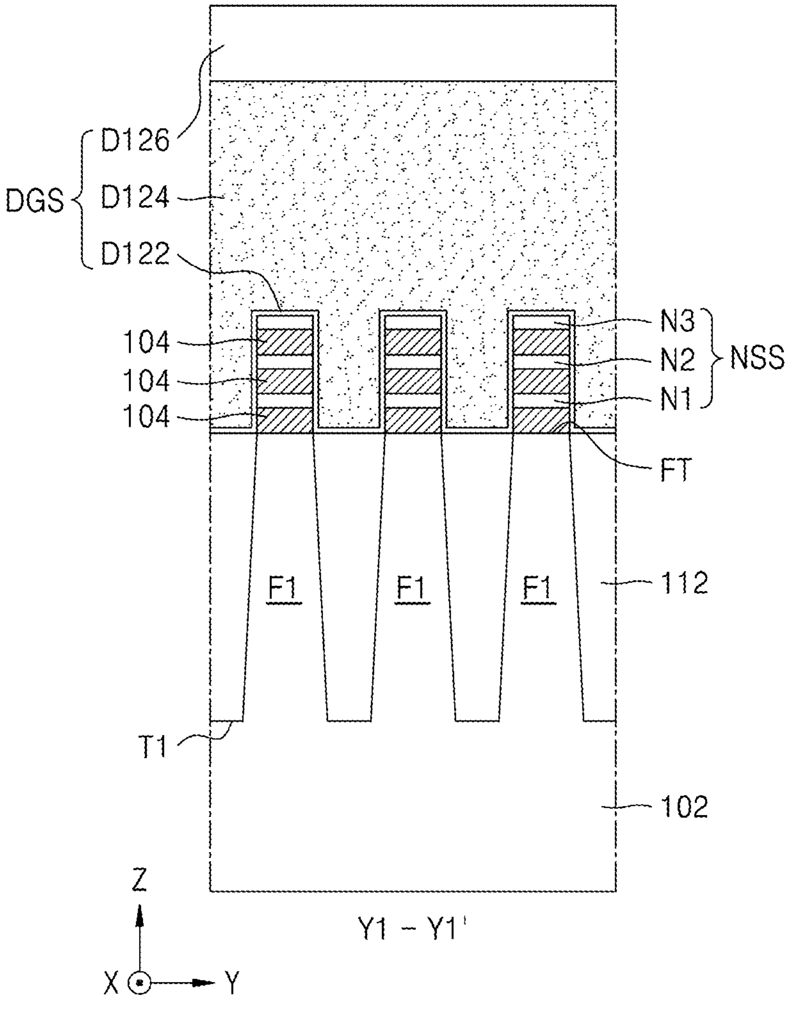

Referring to FIGS. 10A and 10B, a plurality of dummy gate structures DGS may be formed on the stacked structure of the plurality of sacrificial semiconductor layers 104 and the plurality of nano-sheet semiconductor layers NS.

The plurality of dummy gate structures DGS may each be formed to extend long (e.g., lengthwise) in the second horizontal direction (Y direction). The plurality of dummy gate structures DGS may have a structure in which an oxide layer D122, a dummy gate layer D124, and a capping layer D126 are sequentially stacked. For example, the dummy gate layer D124 may include polysilicon and the capping layer D126 may include a silicon nitride.

After forming the plurality of outer insulation spacers 118 covering both (e.g., opposite) sidewalls of each of the plurality of dummy gate structures DGS, portions of the plurality of sacrificial semiconductor layers 104 and the plurality of nano-sheet semiconductor layers NS and portions of the fin-type active regions F1 may be etched by using the plurality of dummy gate structures DGS and the plurality of outer insulation spacers 118 as an etching mask, thereby dividing the plurality of nano-sheet semiconductor layers NS into a plurality of nano-sheet stacks NSS and forming the plurality of recesses R1 in the fin-type active regions F1. The plurality of nano-sheet stacks NSS may each include the first nano-sheet N1, the second nano-sheet N2, and the third nano-sheet N3. To form the plurality of recesses R1, etching may be performed using, e.g., dry etching, wet etching, or a combination thereof.

Figure 11:
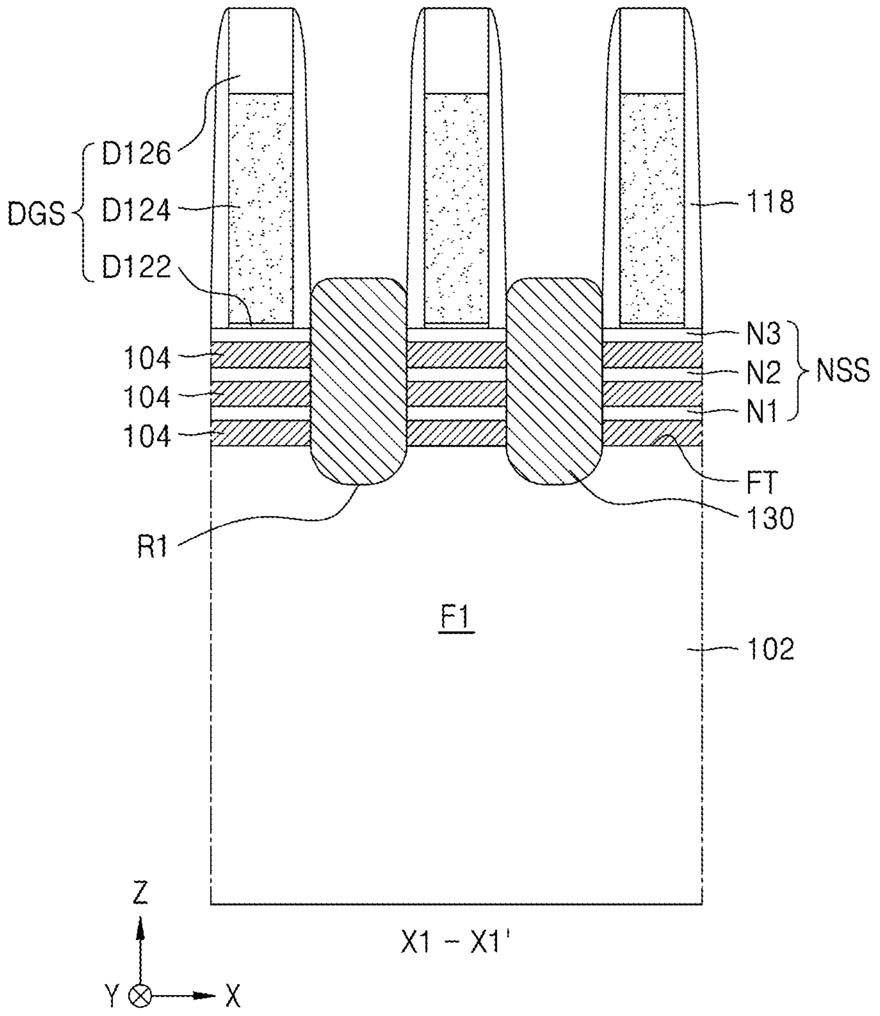

Referring to FIG. 11, in the resultant structure of FIGS. 10A and 10B, the plurality of source/drain regions 130 respectively filling the plurality of recesses R1 may be formed. To form the plurality of source/drain regions 130, a semiconductor material may be epitaxially grown from surfaces of the fin-type active regions FA exposed at the bottom surfaces of the plurality of recesses R1 and sidewalls of the first nano-sheet N1, the second nano-sheet N2, and the third nano-sheet N3 included in the nano-sheet stack NSS.

Figure 12:
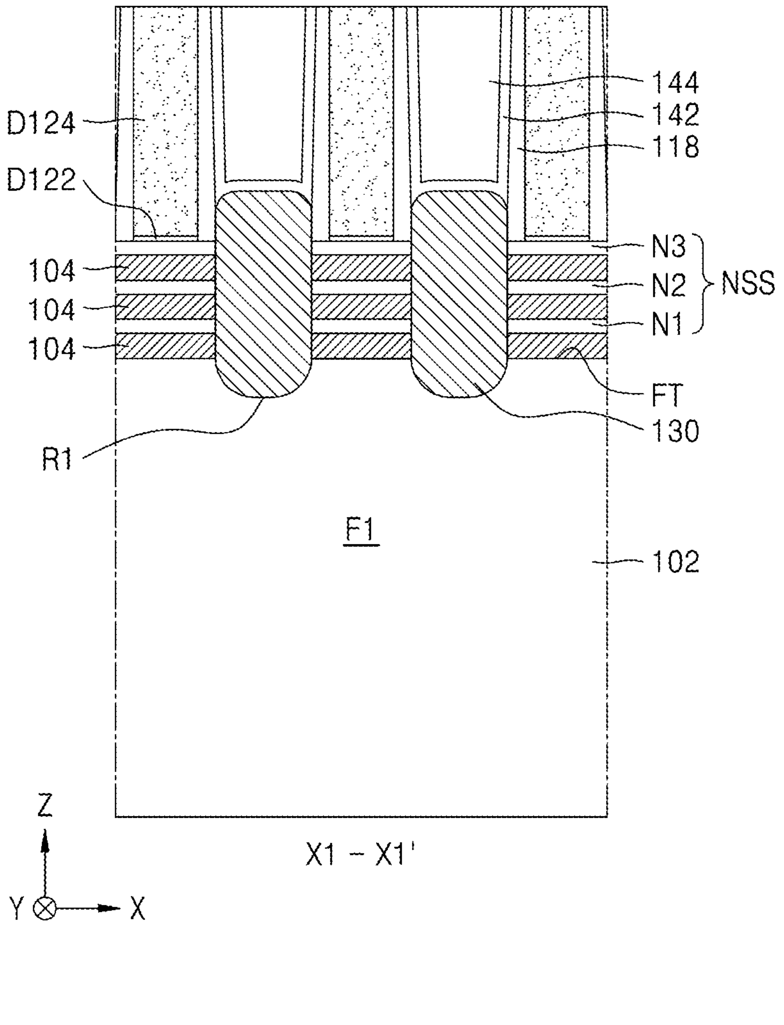

Referring to FIG. 12, after forming the insulation liner 142 covering the resultant structure of FIG. 11 and forming the inter-gate insulation layer 144 on the insulation liner 142, portions of the insulation liner 142 and the inter-gate insulation layer 144 may be etched to expose top surfaces of a plurality of capping layers D126. Thereafter, the dummy gate layer D124 may be exposed by removing the plurality of capping layers D126, and portions of the insulation liner 142 and the inter-gate insulation layer 144 may be removed, such that the top surface of the inter-gate insulation layer 144 and the top surface of the dummy gate layer D124 are at about the same level.

Figure 13:
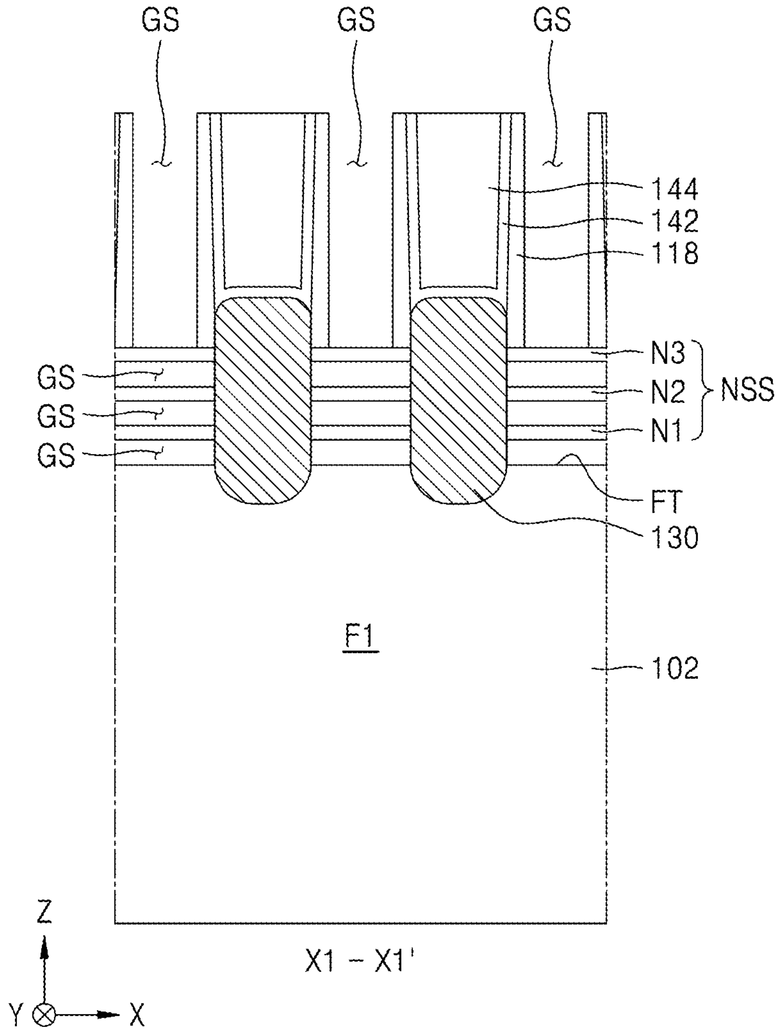

Referring to FIG. 13, a gate space GS may be formed by removing the dummy gate layer D124 and the oxide layer D122 therebelow from the resultant structure of FIG. 12, and the plurality of nano-sheet stacks NSS may be exposed through the gate space GS. Thereafter, the plurality of sacrificial semiconductor layers 104 remaining on the fin active region FA are removed through the gate space GS, and thus the gate space GS may be extended to spaces between the first nano-sheet N1, the second nano-sheet N2, and the third nano-sheet N3 and a space between the first nano-sheet N1 and the top surface FT of the fin active region FA. According to embodiments, to selectively remove the plurality of sacrificial semiconductor layers 104, the difference between the etch selectivity of the first nano-sheet N1, the second nano-sheet N2, and the third nano-sheet N3 and the plurality of sacrificial semiconductor layers 104 may be used.

To selectively remove the plurality of sacrificial semiconductor layers 104, a liquid or gaseous etchant may be used. According to embodiments, to selectively remove the plurality of sacrificial semiconductor layers 104, a $CH_3COOH$-based etchant, e.g., an etchant including a mixture of $CH_3COOH$, $HNO_3$, and HF or an etchant including a mixture of $CH_3COOH$, $H_2O_2$, and HF, may be used.

Figure 14:
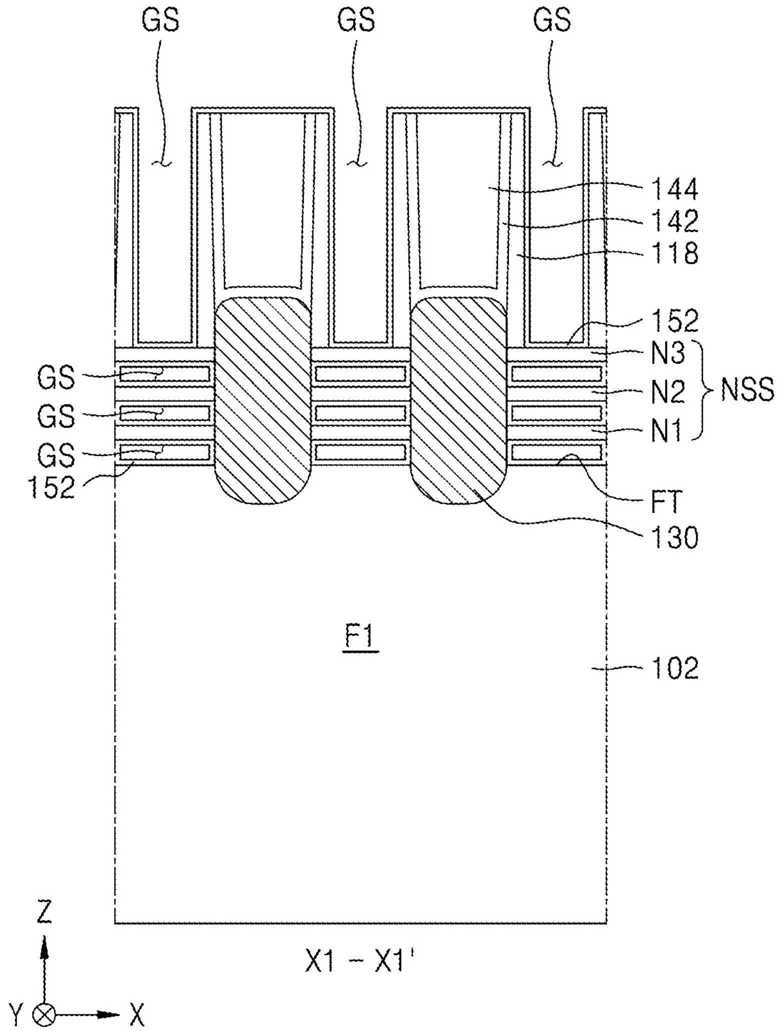

Referring to FIG. 14, in the resultant structure of FIG. 13, the gate dielectric layer 152 covering exposed surfaces of the first nano-sheet N1, second nano-sheet N2, and third nano-sheet N3 and the fin-type active regions FA may be formed. The gate dielectric layer 152 may be formed through an atomic layer deposition (ALD) process.

Figure 15:
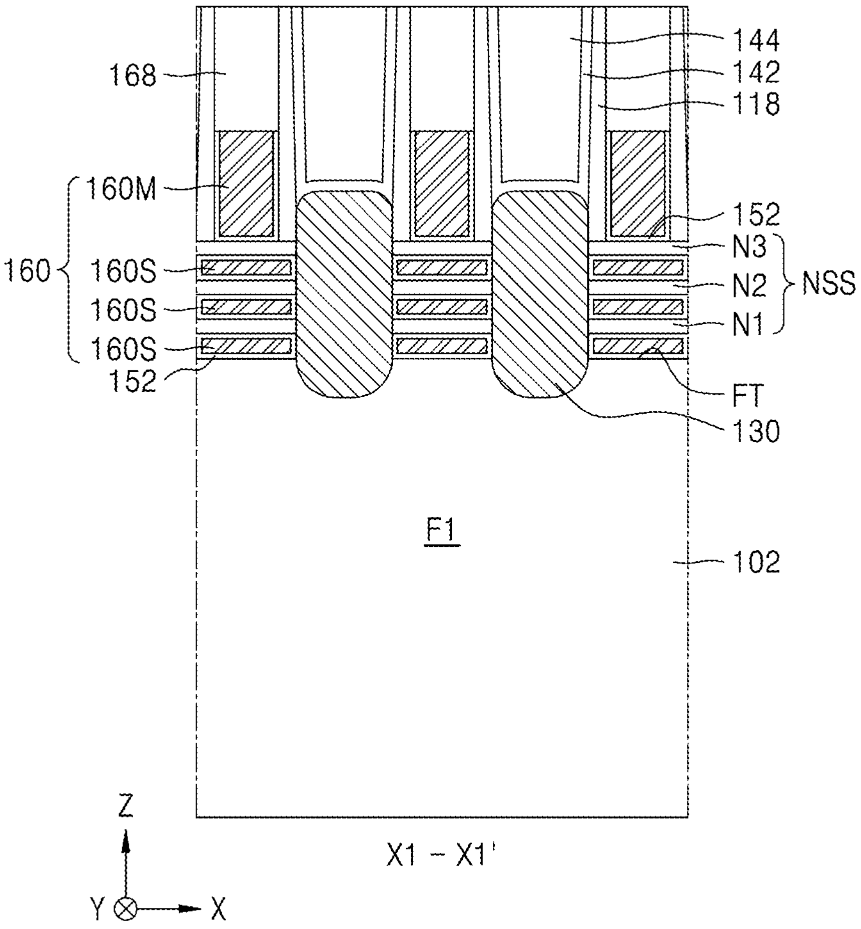

Referring to FIG. 15, the gate line 160 covering the top surface of the inter-gate insulation layer 144 while filling the gate space GS (refer to FIG. 12H) on the gate dielectric layer 152, and the capping insulation pattern 168 covering top surfaces of the gate line 160 and the gate dielectric layer 152 in the gate space GS may be formed.

Figure 16:
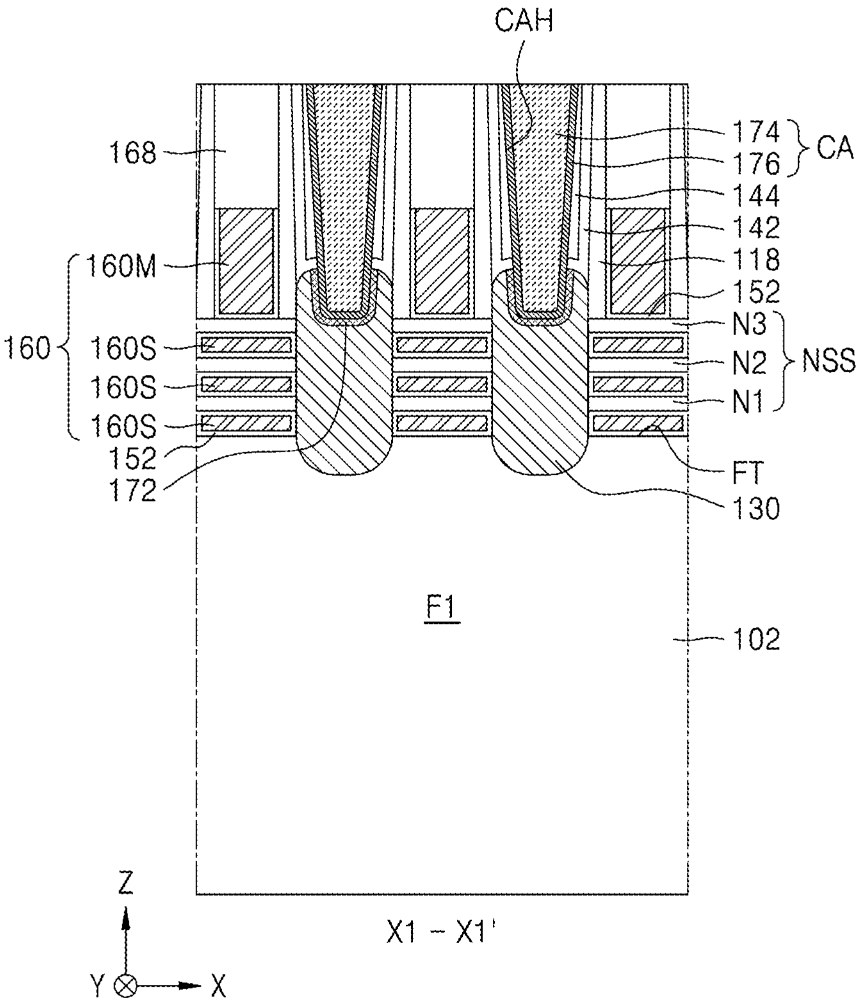

Referring to FIG. 16, in the resultant structure of FIG. 15, a source/drain contact hole CAH penetrating through an insulation structure including the insulation liner 142 and the inter-gate insulation layer 144 and exposing the source/drain region 130 may be formed. A portion of the source/drain region 130 may be removed through an anisotropic etching process through the source/drain contact hole CAH, and thus, the source/drain contact hole CAH may extend longer toward the substrate 102. According to embodiments, an anisotropic etching process for forming the source/drain contact hole CAH may be performed using plasma.

After the source/drain contact hole CAH is formed, the metal silicide layer 172 may be formed on a portion of the source/drain region 130 exposed at the bottom side of the source/drain contact hole CAH. According to embodiments, to form the metal silicide layer 172, a process of forming a metal liner conformally covering the inner wall of the source/drain contact hole CAH and inducing a reaction between the source/drain region 130 and a metal constituting the metal liner by heat-treating the metal liner may be included. After the metal silicide layer 172 is formed, remaining portions of the metal liner may be removed. A portion of the source/drain region 130 may be consumed during the process of forming the metal silicide layer 172. For example, when the metal silicide layer 172 includes a titanium silicide layer, the metal liner may include a Ti layer.

Figure 17:
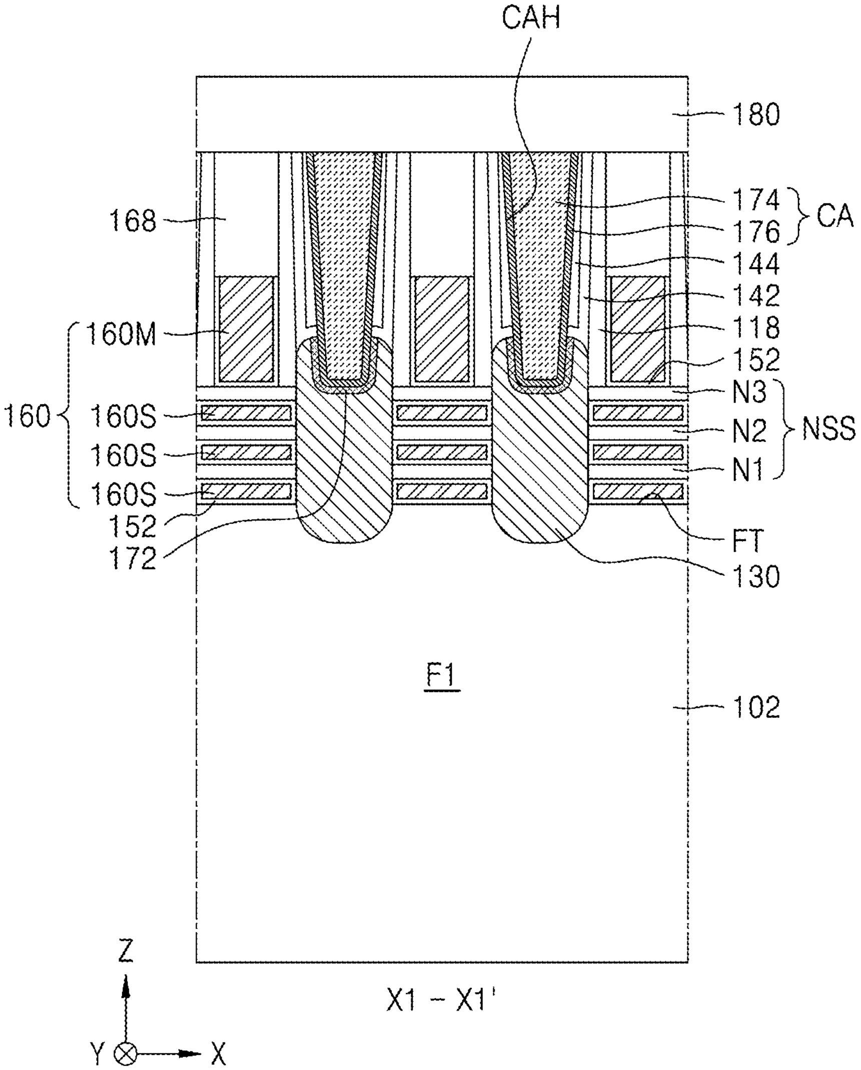

Referring to FIG. 17, in the resultant structure of FIG. 16, the source/drain contact CA including the conductive barrier pattern 176 and the contact plug 174 may be formed inside each of a plurality of source/drain contact holes CAH. Thereafter, the upper insulation structure 180 covering top surfaces of the source/drain contact CA and the plurality of capping insulation patterns 168 may be formed.

Figure 18:
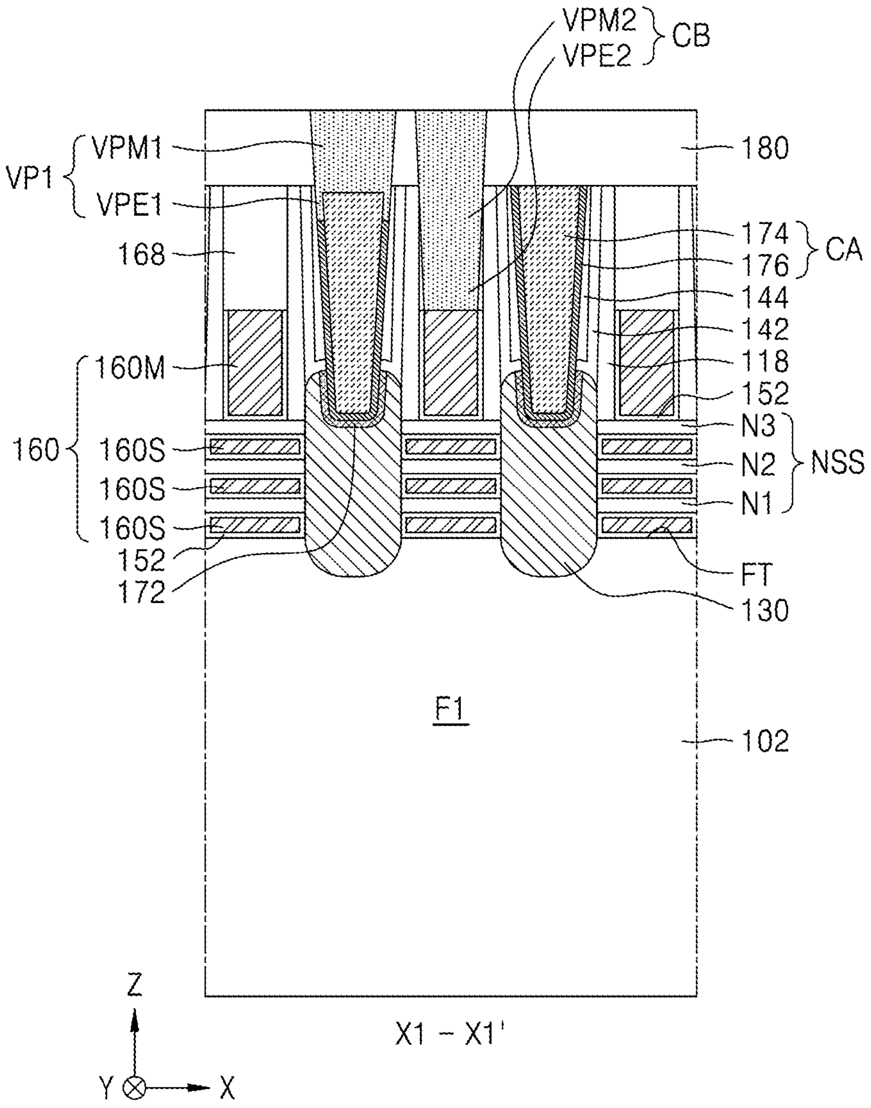

Referring to FIG. 18, in the result structure of FIG. 17, the via contact VP1 connected to the source/drain contact CA and the gate contact CB connected to the gate line 160 may be formed. The dummy contact DCB may also be formed through the same process (e.g., as the gate contact CB). For example, the distance between adjacent ones of the via contacts VP1 and the distance between the dummy contact DCB and a corresponding one of the via contacts VP1 may not exceed 200 nm.

Due to the increase in integration, the number of stacked gate electrode layers is increasing. Carbon from hydrofluorocarbons, an etching chemical generated during a hole etching process, may be deposited in holes and polymerized to form polymers during etching. Deposition of the polymer may occur adjacent to sidewalls of a hardmask pattern near the upper sidewall of a hole. As the thickness of an insulation layer increases and the amount to be etched during a hole etching process increases, the amount of polymer generated in the hole etching process increases.

A small amount of polymer is formed in a portion with a high hole pattern density, whereas a large amount of polymer is formed in a portion with a low hole pattern density and far from adjacent holes. Since the gate contact CB is disposed in isolation, a thick polymer film is deposited on the upper sidewall of a hole during an etching process of forming the hole, and the entrance of the hole may be blocked by the polymer film, and thus the flow of an etchant into the hole may be blocked. In this case, unless the bottom of the hole is exposed, an open defect problem may occur.

In contrast, according to embodiments described herein, the dummy contact DCB is additionally disposed around, e.g., adjacent to, the gate contact CB (e.g., or the source/drain contact CA). The dummy contact DCB is formed together with the gate contact CB when the gate contact CB is formed (e.g., and/or together with the source/drain contact CA when the source/drain contact CA is formed), so during a hole etching process of forming the gate contact CB, a dummy contact hole may be additionally formed at a location adjacent to the gate contact hole. As such, in a process of filling the gate contact hole with a conductive material, the dummy contact hole may also be filled with the conductive material, thereby forming the gate contact CB and the dummy contact DCB (e.g., and/or the source/drain contact CA) at once, e.g., simultaneously.

Since the pattern density of a gate contact hole forming region is increased by the dummy contact hole, excessive generation of polymer due to a low pattern density during hole etching may be suppressed or substantially minimized, thereby preventing the gate contact hole from being blocked by the polymer. Therefore, since an etchant may be smoothly introduced into the gate contact hole, the opening defect of the gate contact hole may be prevented or substantially minimized. Therefore, a defect that the gate contact CB is not electrically connected due to the open defect of the gate contact hole may be prevented. As such, embodiments provide reduction of dummy yield occurring during formation of a gate via by forming a dummy contact in an active region.

According to embodiments, the dummy contact DCB, the via contact VP1, and the gate contact CB may be formed at the same time, e.g., simultaneously. According to other embodiments, the dummy contact DCB, the via contact VP1, and the gate contact CB may be sequentially formed through separate processes. In this case, the dummy contact DCB and the gate contact CB may be formed after the via contact VP1 is formed first, the dummy contact DCB and the via contact VP1 may be formed after the gate contact CB is formed, or the gate contact CB and the via contact VP1 may be formed after the dummy contact DCB may be formed first.

An example method of manufacturing the integrated circuit device 100 shown in FIGS. 1, 2A, and 2B has been described above with reference to FIGS. 8A to 18. However, the integrated circuit devices 200*a*, 200*b*, and 200*c* shown in FIGS. 3A to 4C and various integrated circuit devices having similar structures thereto may be manufactured by making various modifications to the descriptions given with reference to FIGS. 8A to 18.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
- a first conductive pattern on a substrate;
- a second conductive pattern surrounding a portion of the first conductive pattern and covering a lower portion of a sidewall of the first conductive pattern;
- an upper insulation structure on the first conductive pattern and the second conductive pattern;
- an upper conductive pattern penetrating through the upper insulation structure and extending in a vertical direction, the upper conductive pattern including:
  - a main plug portion overlapping the first conductive pattern and the second conductive pattern in the vertical direction, and
  - a vertical extension extending from the main plug portion toward the substrate, the vertical extension covering an upper portion of the sidewall of the first conductive pattern and overlapping the second conductive pattern in the vertical direction; and
- a dummy contact on a single diffusion break region on the substrate;

wherein a distance between the upper conductive pattern and another upper conductive pattern is identical to a distance between the dummy contact and the upper conductive pattern.

2. The integrated circuit device as claimed in claim 1, wherein the dummy contact has a shape that is identical to a shape of the upper conductive pattern, as viewed in a top view.

3. The integrated circuit device as claimed in claim 1, wherein the distance between the upper conductive pattern and the other upper conductive pattern does not exceed 200 nm.

4. The integrated circuit device as claimed in claim 1, wherein the upper conductive pattern and the dummy contact include a same material.

5. The integrated circuit device as claimed in claim 1, wherein the dummy contact is electrically connected to a metal wire.

6. The integrated circuit device as claimed in claim 1, wherein:

the dummy contact and the upper conductive pattern have a rectangular or square shape when viewed from above, sizes of the dummy contact and the upper conductive pattern are defined by a length of a smallest side of the rectangular or square shape, and the sizes of the dummy contact and the upper conductive pattern are identical to each other.

7. The integrated circuit device as claimed in claim 1, wherein:

the first conductive pattern includes a top portion protruding in a direction oriented away from the substrate farther than the second conductive pattern, and the top portion of the first conductive pattern is accommodated in a space defined by the vertical extension.

8. The integrated circuit device as claimed in claim 1, further comprising a source/drain region between the substrate and the first conductive pattern, the first conductive pattern and the second conductive pattern being electrically connected to the source/drain region.

9. The integrated circuit device as claimed in claim 1, further comprising a channel region between the substrate and the second conductive pattern, the upper conductive pattern being in contact with portions of the first conductive pattern and the second conductive pattern.

* * * * *